US 9,070,546 B2

(12) United States Patent
Umezaki

(10) Patent No.: US 9,070,546 B2
(45) Date of Patent: Jun. 30, 2015

(54) SEMICONDUCTOR DEVICE

(71) Applicant: Semiconductor Energy Laboratory Co., Ltd., Atsugi-shi, Kanagawa-ken (JP)

(72) Inventor: Atsushi Umezaki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/968,593

(22) Filed: Aug. 16, 2013

(65) Prior Publication Data

US 2014/0070880 A1 Mar. 13, 2014

(30) Foreign Application Priority Data

Sep. 7, 2012 (JP) .................. 2012-197224

(51) Int. Cl.
*H03K 3/00* (2006.01)
*H01L 25/00* (2006.01)
*G11C 19/28* (2006.01)
*G02F 1/1362* (2006.01)
*H01L 27/12* (2006.01)

(52) U.S. Cl.
CPC ......... *H01L 25/00* (2013.01); *H01L 2924/0002* (2013.01); *G11C 19/28* (2013.01); *G02F 1/1362* (2013.01); *H01L 27/1225* (2013.01)

(58) Field of Classification Search
CPC .................. H03K 19/0185; H03K 19/018507; H03K 19/018521
USPC .................. 327/108, 109, 110, 111, 112, 390
See application file for complete search history.

(56) References Cited

U.S. PATENT DOCUMENTS

| | | | | |
|---|---|---|---|---|
| 6,051,995 | A * | 4/2000 | Pollachek | 326/87 |
| 6,057,718 | A * | 5/2000 | Keeth | 327/112 |
| 7,368,952 | B2 * | 5/2008 | Ojiro | 326/87 |
| 7,633,477 | B2 | 12/2009 | Jang et al. | |
| 7,750,688 | B2 * | 7/2010 | La Placa et al. | 327/108 |
| 7,978,274 | B2 | 7/2011 | Umezaki et al. | |
| 2012/0286855 | A1 | 11/2012 | Umezaki | |
| 2013/0082760 | A1 | 4/2013 | Umezaki | |
| 2013/0140617 | A1 | 6/2013 | Umezaki | |

FOREIGN PATENT DOCUMENTS

JP 2007-004167 A 1/2007

* cited by examiner

*Primary Examiner* — Jeffrey Zweizig
(74) *Attorney, Agent, or Firm* — Fish & Richardson P.C.

(57) ABSTRACT

Provided is a semiconductor device in which change in characteristics of a transistor is suppressed and an output signal is changed sharply without increasing W/L of the transistor can be provided. Two transistors are connected in parallel between a wiring to which a low potential is supplied and an output terminal. When the low potential is output from the output terminal, both of the two transistors are turned on and then one of them is turned off. Thus, change in characteristics of the transistor can be suppressed and an output signal can be changed sharply without increasing W/L of the transistor.

10 Claims, 17 Drawing Sheets

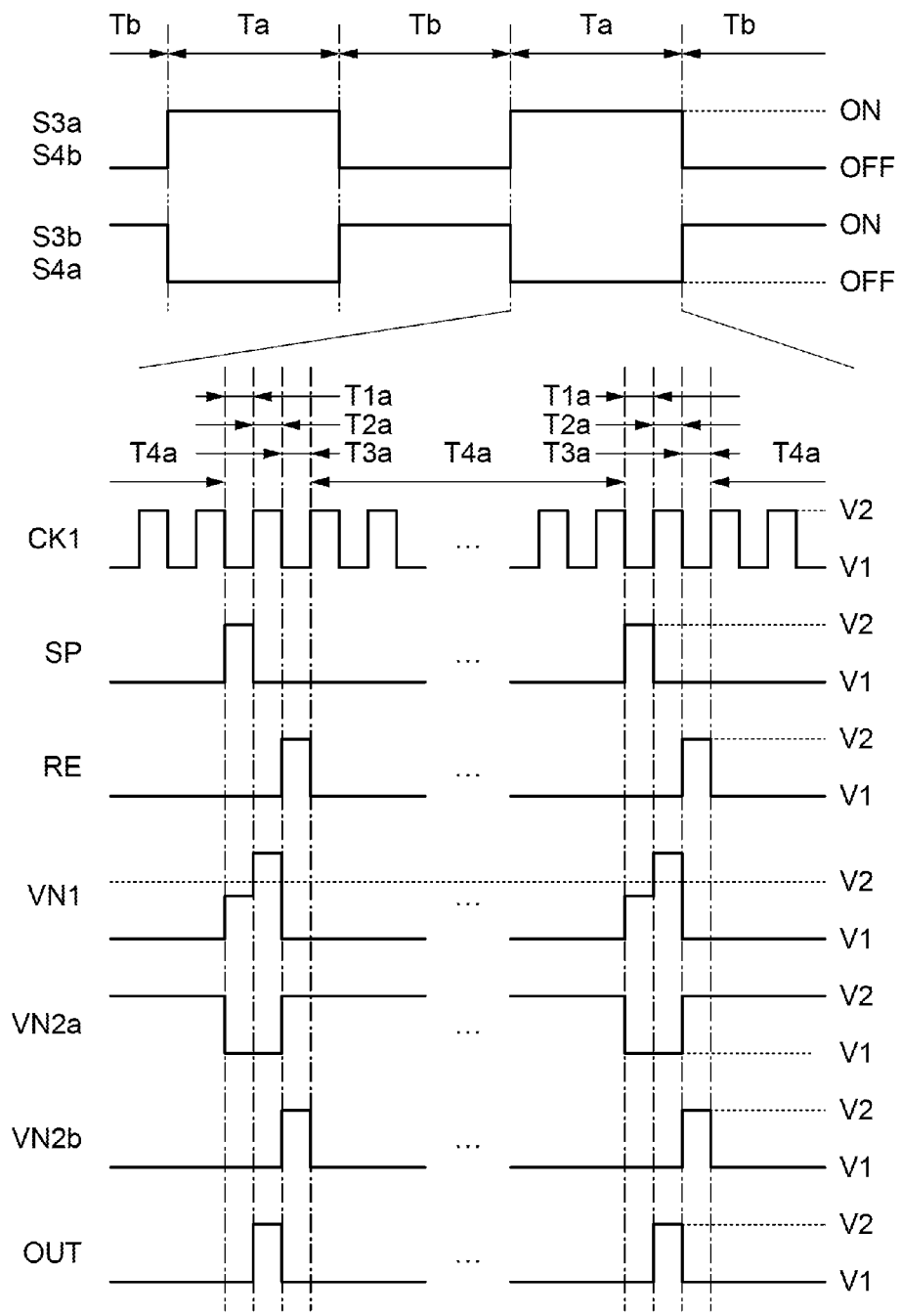

T3b

T4b 207 206 204 201 205 208    214 213 212 202 215

--PRIOR ART--

--PRIOR ART--

--PRIOR ART--

--PRIOR ART--

SEMICONDUCTOR DEVICE

BACKGROUND OF THE INVENTION

1. Field of the Invention

One embodiment of the present invention relates to a semiconductor device and a display device including the semiconductor device. In particular, one embodiment of the present invention relates to a sequential circuit and a semiconductor device including the sequential circuit, such as a shift register.

2. Description of the Related Art

Recently, a sequential circuit formed using transistors having the same polarity has been actively developed. In particular, Patent Document 1 discloses a sequential circuit that can suppress change in transistor characteristics.

FIG. 17A illustrates a configuration of a conventional sequential circuit. The conventional sequential circuit includes a transistor T13, and transistors T14 and T15 which are connected in parallel. In the conventional sequential circuit, the transistor T13 is turned on and the transistors T14 and T15 are turned off, thereby outputting a first clock signal C1. When the first clock signal C1 is high, a first scan signal Vg1 becomes high (see FIG. 17B). In an odd-numbered frame, the transistor T13 is turned off, the transistor T14 is turned on, and the transistor T15 is turned off, thereby outputting a first supply voltage VSS (see FIG. 17C). In an even-numbered frame, the transistor T13 is turned off, the transistor T14 is turned off, and the transistor T15 is turned on, thereby outputting the first supply voltage VSS (see FIG. 17D). In this manner, the transistor T15 is turned off in an odd-numbered frame and the transistor T14 is turned off in an even-numbered frame, so that change in characteristics of the transistors T14 and T15 is suppressed.

REFERENCE

Patent Document

[Patent Document 1] Japanese Published Patent Application No. 2007-004167

SUMMARY OF THE INVENTION

However, since one of two transistors connected in parallel is turned off and the other thereof is driven in the conventional sequential circuit, each of the two transistors connected in parallel needs to have sufficient driving ability. Accordingly, there is a problem that W (channel width)/L (channel length) of the transistor is large. On the other hand, if W/L of the transistor is not large enough, there is another problem that an output signal changes slowly and thus delay, distortion, or the like of the output signal occurs.

In view of the above problems, an object of one embodiment of the present invention is to provide a semiconductor device in which change in characteristics of a transistor is suppressed and an output signal is changed sharply without increasing W/L of the transistor. Another object of one embodiment of the present invention is to provide a semiconductor device with a novel circuit configuration. Note that the descriptions of these problems do not disturb the existence of other problems. Note that in one embodiment of the present invention, there is no need to achieve all the objects. Other objects will be apparent from and can be derived from the description of the specification, the drawings, the claims, and the like.

One embodiment of the present invention is a method for driving a semiconductor device including a first transistor, a second transistor, a third transistor, and means for controlling on/off of the first transistor, the second transistor, and the third transistor. One of a source and a drain of the first transistor is supplied with a first signal. One of a source and a drain of the second transistor is supplied with a first potential, and the other is electrically connected to the one of the source and the drain of the first transistor. One of a source and a drain of the third transistor is electrically connected to the other of the source and the drain of the second transistor. The other of the source and the drain of the third transistor is electrically connected to the other of the source and the drain of the first transistor. The semiconductor device sequentially repeats a first period and a second period. The first period includes a first step of outputting the first signal through the first transistor, a second step of outputting the first potential through the second transistor and the third transistor, and a third step of outputting the first potential through the second transistor. The second period includes a fourth step of outputting the first signal through the first transistor, a fifth step of outputting the first potential through the second transistor and the third transistor, and a sixth step of outputting the first potential through the third transistor.

The embodiment of the present invention may perform each of the first step, the second step, and the third step two times or more in the first period, and then perform each of the fourth step, the fifth step, and the sixth step two times or more in the second period. Further, in the embodiment of the present invention, the channel width of the second transistor may be more than or equal to 90% and less than or equal to 110% of the channel width of the third transistor. In the embodiment of the present invention, the channel width of the first transistor may be larger than the channel width of the second transistor and the channel width of the third transistor.

One embodiment of the present invention is a semiconductor device including a first transistor, a second transistor, a first switch, a second switch, a third switch, and a fourth switch. One of a source and a drain of the first transistor is electrically connected to a first wiring, and the other of the source and the drain of the first transistor is electrically connected to a second wiring. One of a source and a drain of the second transistor is electrically connected to the first wiring, and the other of the source and the drain of the second transistor is electrically connected to the second wiring. A first terminal of the first switch is electrically connected to a gate of the first transistor. A first terminal of the second switch is electrically connected to a gate of the second transistor, and a second terminal of the second switch is electrically connected to a first terminal of the first switch. A first terminal of the third switch is electrically connected to the gate of the first transistor, and a second terminal of the third switch is electrically connected to a third wiring. A first terminal of the fourth switch is electrically connected to the gate of the second transistor, and a second terminal of the fourth switch is electrically connected to the third wiring.

The one embodiment of the present invention may include a third transistor and a fourth transistor. One of a source and a drain of the third transistor is electrically connected to a fourth wiring, and the other of the source and the drain of the third transistor is electrically connected to a second terminal of the first switch. One of a source and a drain of the fourth transistor is electrically connected to the second wiring, and the other of the source and the drain of the fourth transistor is electrically connected to the second terminal of the first switch. Further, the one embodiment of the present invention may include a first period during which the first switch and the fourth switch are on and the second switch and the third switch are off, and a second period during which the first switch and the fourth switch are off and the second switch and the third switch are on.

According to one embodiment of the present invention, a semiconductor device in which change in characteristics of a transistor is suppressed and an output signal is changed sharply without increasing W/L of the transistor can be provided. Further, according to one embodiment of the present invention, a semiconductor device with a novel circuit configuration can be provided.

BRIEF DESCRIPTION OF THE DRAWINGS

FIG. 2 is a timing diagram of the sequential circuit.

DETAILED DESCRIPTION OF THE INVENTION

Figure 1A:
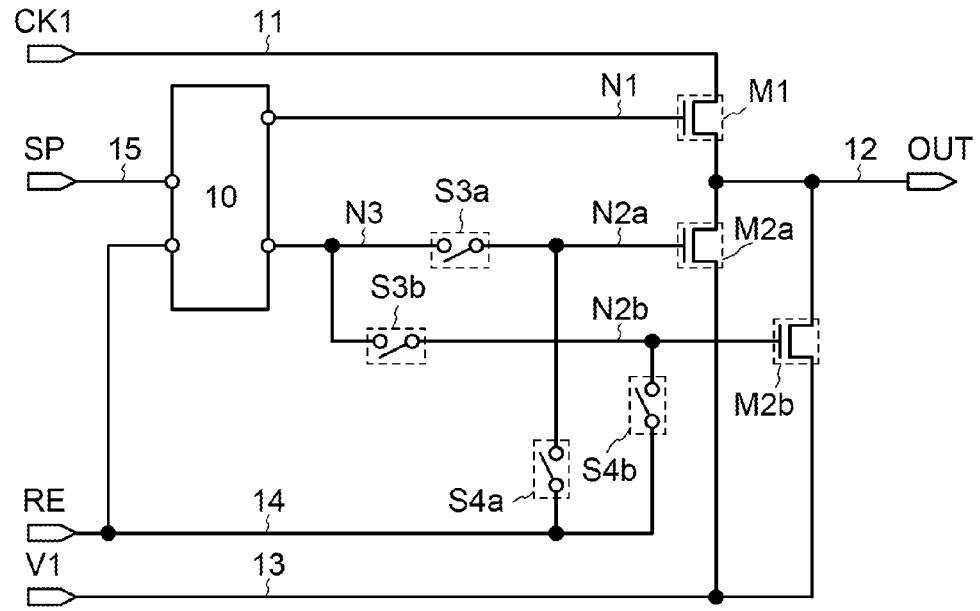
FIGS. 1A and 1B illustrate a configuration of a sequential circuit.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Note that the present invention includes, in its category, any semiconductor device including transistors, for example, integrated circuits, RF tags, and display devices. The integrated circuits include, in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). The display device includes, in its category, a liquid crystal display device, a light-emitting device in which a light-emitting element typified by an organic light-emitting element (OLED) is provided in each pixel, electronic paper, a digital micromirror device (DMD), a plasma display panel (PDP), a field emission display (FED), and the like.

In this specification, the display device includes, in its category, a panel in which a display element such as a liquid crystal element or a light-emitting element is provided in each pixel, and a module in which an IC or the like including a controller is mounted on the panel.

Note that the term "connection" in this specification refers to electrical connection and corresponds to the state in which current, a potential, or voltage can be supplied or transmitted. Accordingly, a connection state means not only a state of a direct connection but also a state of indirect connection through a circuit element such as a wiring, a resistor, a diode, or a transistor so that current, a potential, or voltage can be supplied or transmitted. In addition, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

Note that a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

The terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

[Embodiment 1]

In this embodiment, a sequential circuit (also referred to as a semiconductor device) according to one embodiment of the present invention will be described.

FIG. 1A illustrates a sequential circuit of this embodiment. The sequential circuit of FIG. 1A includes a transistor M1, a transistor M2a, a transistor M2b, a switch S3a, a switch S3b, a switch S4a, a switch S4b, and a circuit 10.

A first terminal (also referred to as one of a source and a drain) of the transistor M1 is connected to a wiring 11, a second terminal (also referred to as the other of the source and the drain) of M1 is connected to a wiring 12, and a gate of M1 is connected to a node N1. A first terminal, a second terminal, and a gate of the transistor M2a are connected to a wiring 13, a wiring 12, and a node N2a, respectively. A first terminal, a second terminal, and a gate of the transistor M2b are connected to the wiring 13, the wiring 12, and a node N2b, respectively. A first terminal and a second terminal of the switch S3a are connected to a node N3 and the node N2a, respectively. A first terminal and a second terminal of the switch S3b are connected to the node N3 and the node N2b, respectively. A first terminal and a second terminal of the switch S4a are connected to the wiring 14 and the node N2a, respectively. A first terminal and a second terminal of the switch S4b are connected to the wiring 14 and the node N2b, respectively. A first terminal, a second terminal, a third terminal, and a fourth terminal of the circuit 10 are connected to a wiring 15, the wiring 14, the node N1, and the node N3, respectively.

The circuit 10 has a function of supplying a potential for controlling on/off of the transistor M1 to the node N1. Specifically, the circuit 10 has a function of supplying a potential at which the transistor M1 is turned on to the node N1 and then making the node N1 go into a floating state. Further, the circuit 10 has a function of supplying a potential at which the transistor M1 is turned off to the node N1. Further, the circuit 10 has a function of supplying a potential for controlling on/off of the transistor M2a or the transistor M2b to the node N3. Specifically, the circuit 10 has a function of supplying a potential at which the transistor M2a or the transistor M2b is turned on to the node N3. Further, the circuit 10 has a function of supplying a potential at which the transistor M2a or the transistor M2b is turned off to the node N3. Note that the potential supplied from the circuit 10 to the node N3 is supplied to the node N2a when the switch S3a is on, whereas the potential is supplied to the node N2b when the switch S3b is on. In addition, connection relations of the circuit 10 can be changed as appropriate depending on the configuration of the circuit 10.

Note that all the transistors included in the sequential circuit have the same polarity; the polarity is either N-channel or P-channel. In this embodiment, the transistors M1, M2a, and M2b are N-channel transistors.

Note that each of the transistors has a function of controlling conduction/non-conduction between a portion to which the first terminal is connected and a portion to which the second terminal is connected. For example, the transistor M1 has a function of controlling conduction/non-conduction between the wiring 11 and the wiring 12. The transistor M2a has a function of controlling conduction/non-conduction between the wiring 13 and the wiring 12. The transistor M2b has a function of controlling conduction/non-conduction between the wiring 13 and the wiring 12.

Note that each of the transistors have a function of maintaining a difference in potential between a portion to which a gate is connected and the portion to which the first terminal or the second terminal is connected. For example, the transistor M1 has a function of maintaining a potential difference between the wiring 12 and the node N1.

Note that the transistors may be replaced by switches. The first terminal and the second terminal of the transistor correspond to the first terminal and the second terminal of the switch, respectively. For example, the transistor M2a may be replaced by a switch having a first terminal connected to the wiring 13 and a second terminal connected to the wiring 12. The transistor M2b may be replaced by the switch having the first terminal connected to the wiring 13 and the second terminal connected to the wiring 12.

Note that the wirings are inputted with a signal, a potential, or the like and have a function of transmitting the inputted signal, potential, or the like. For example, the signal or the potential of the wiring 11 preferably has a function of increasing the potential of the wiring 12. The signal or the potential of the wiring 13 preferably has a function of decreasing the potential of the wiring 12. The wiring 14 preferably has a function of controlling on/off of the transistor M2a, a function of controlling on/off of the transistor M2b, or a function of controlling the circuit 10. The signal or the potential of the wiring 15 preferably has a function of controlling the circuit 10.

For convenience, in this embodiment, the signal CK1 (also referred to as clock signal) is input to the wiring 11, the signal OUT (also referred to as output signal) is output via the wiring 12, the potential V1 (also referred to as first potential) is supplied to the wiring 13, the signal RE (also referred to as reset signal) is input to the wiring 14, and the signal SP (also referred to as start pulse) is input to the wiring 15. For convenience, the signals CK1, SP, and RE are high or low (have high level and low level). A low-level potential is the potential V1, and a high-level potential is a potential V2 (also referred to as second potential). Note that the potential V2 is higher than the potential V1.

Next, operation of the sequential circuit of FIG. 1A will be described.

Figure 3:
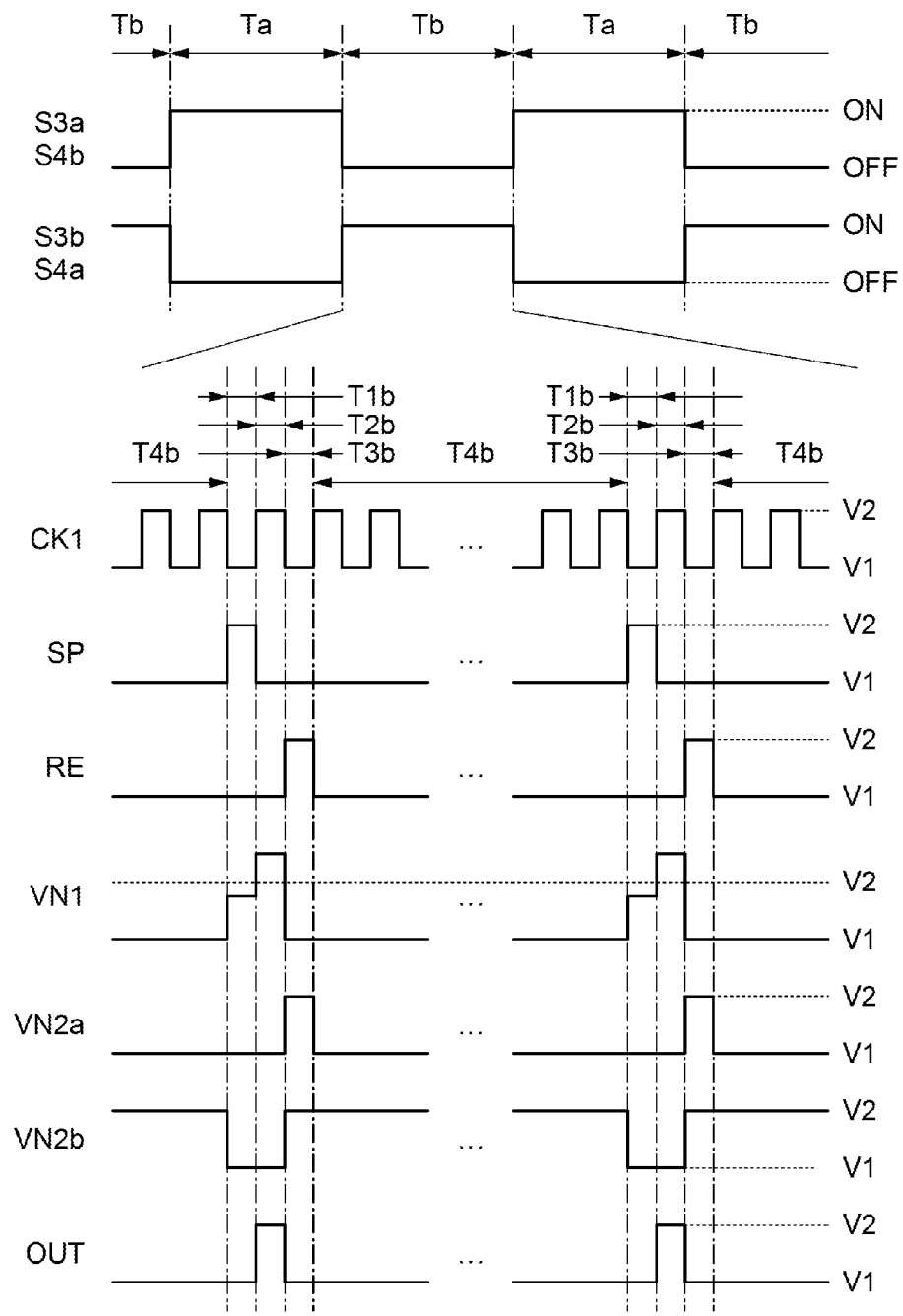
FIG. 3 is a timing diagram of the sequential circuit.

FIG. 2 and FIG. 3 are examples of a timing diagram showing the operation of the sequential circuit of FIG. 1A. The timing diagrams of FIG. 2 and FIG. 3 each have a period Ta and a period Tb. FIG. 2 is the timing diagram of the period Ta including a period T1a to a period T4a. FIG. 3 is the timing diagram of the period Tb including a period T1b to a period T4b. In addition, FIG. 2 and FIG. 3 show the followings: on/off relation between the switch S3a and the switch S4b, on/off relation between the switch S3b and the switch S4a, the signal CK1, the signal SP, the signal RE, a potential VN1 of the node N1, a potential VN2a of the node N2a, a potential VN2b of the node N2b, and the signal OUT.

Figure 4A:
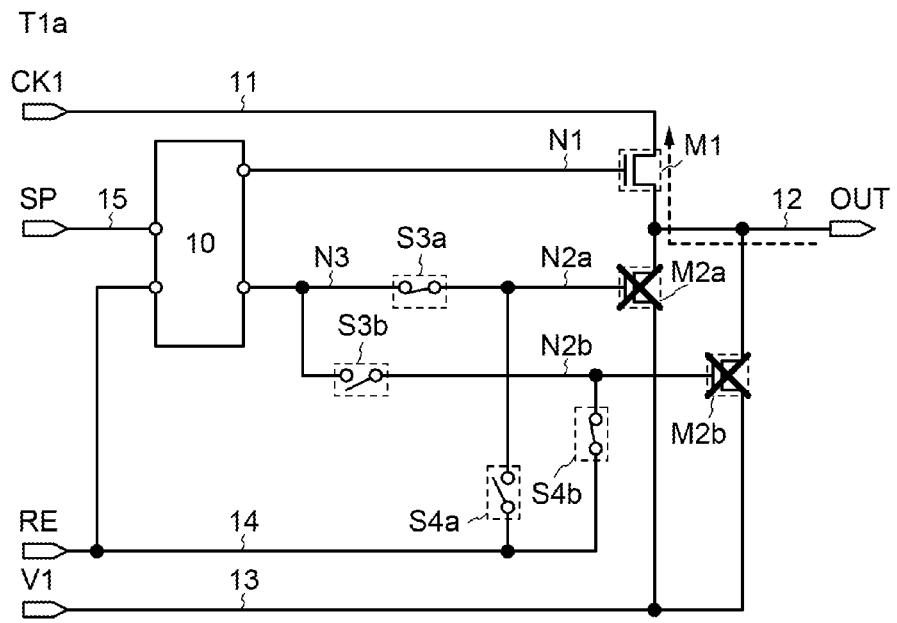
FIGS. 4A and 4B illustrate operations of the sequential circuit.
Figure 4B:
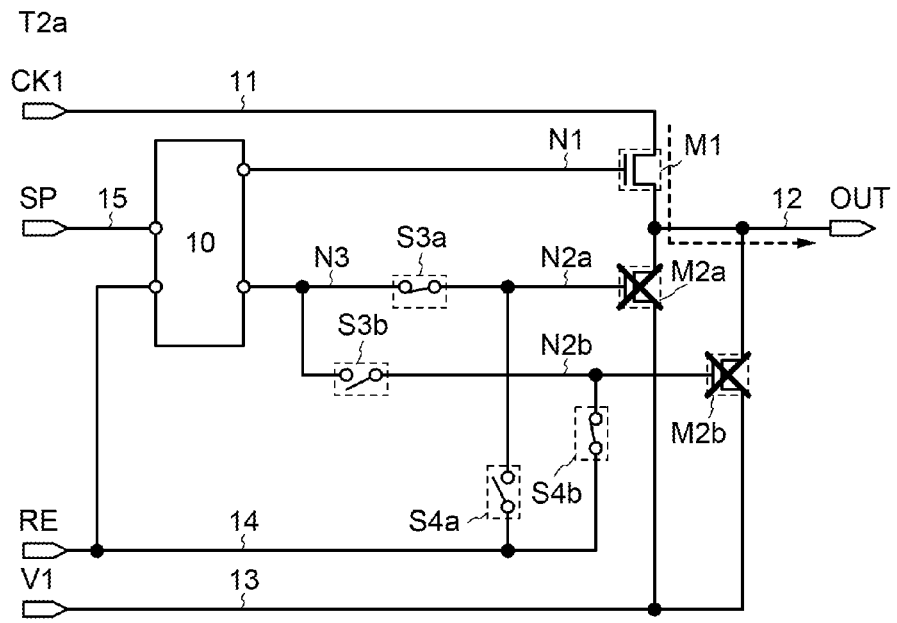
Figure 5A:
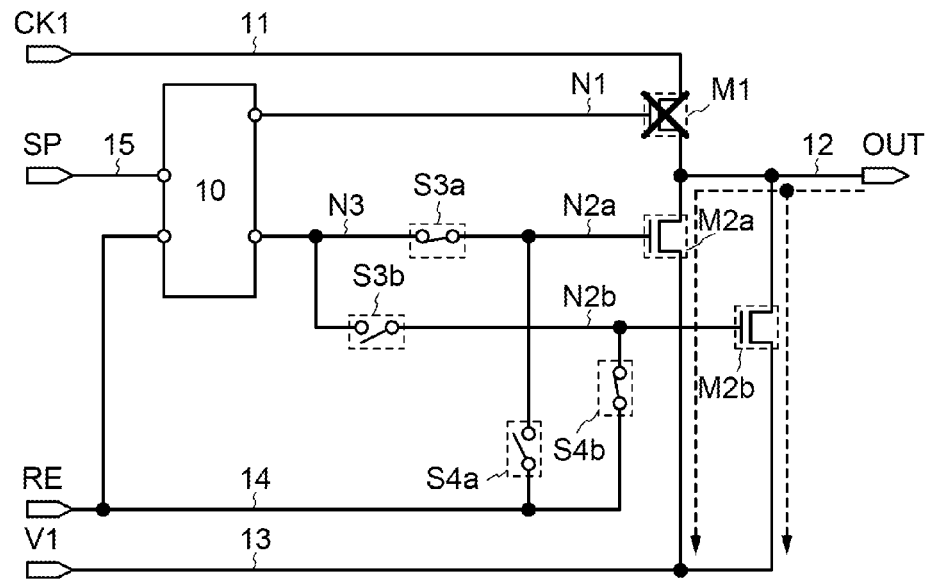
FIGS. 5A and 5B illustrate operations of the sequential circuit.
Figure 5B:
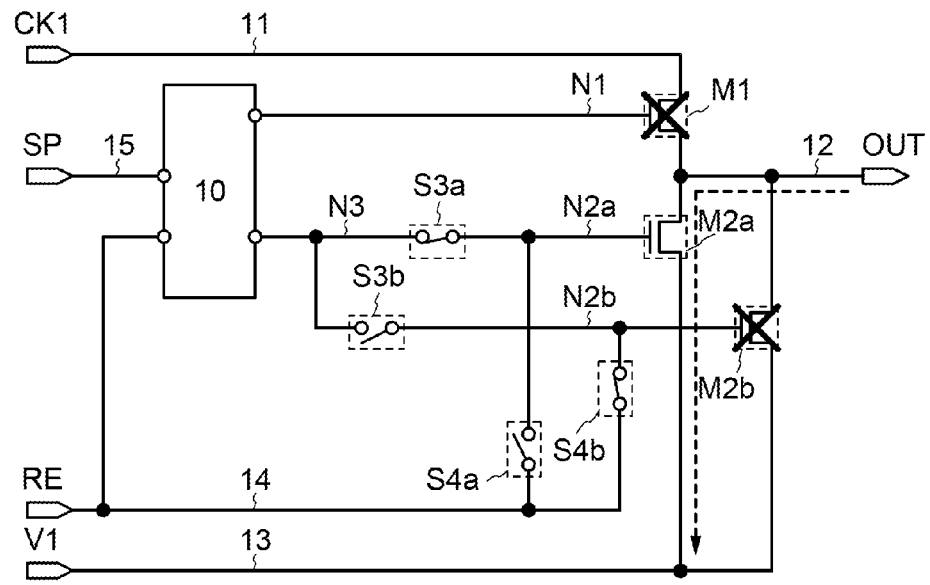
Figure 6A:
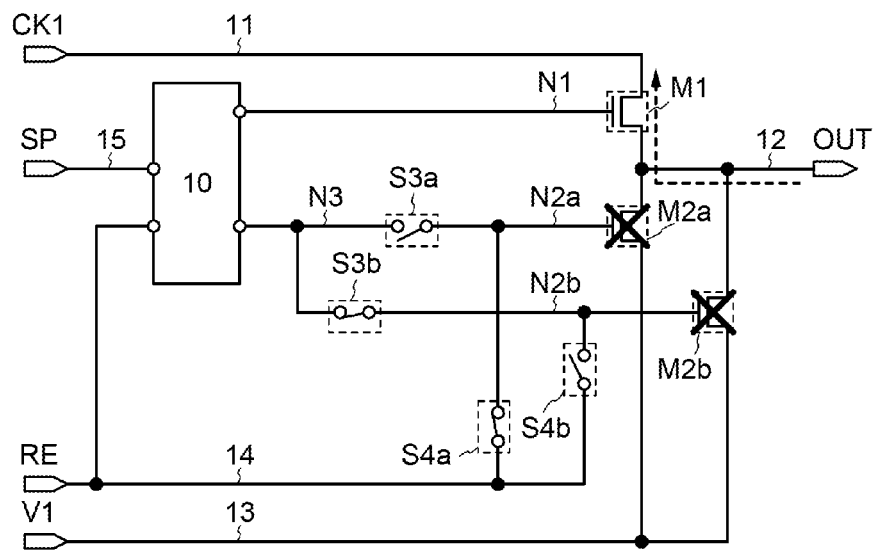
FIGS. 6A and 6B illustrate operations of the sequential circuit.
Figure 6B:
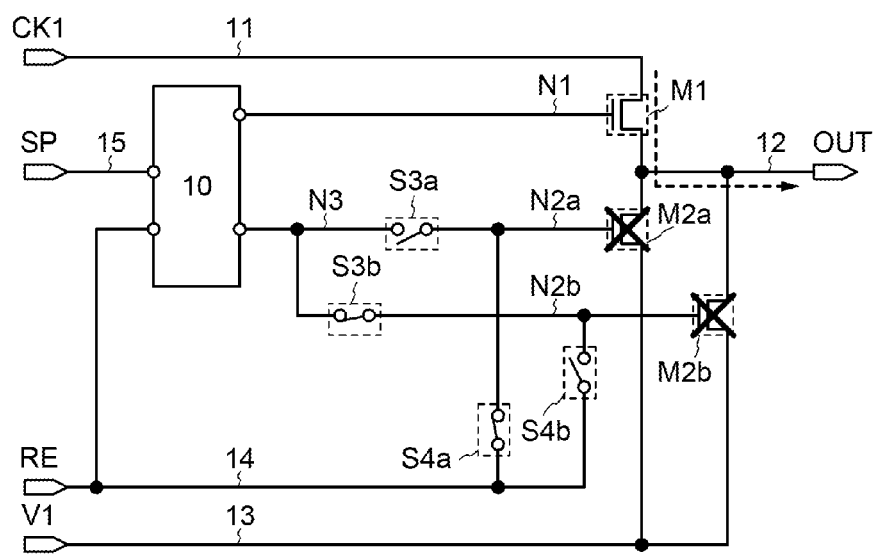
Figure 7A:
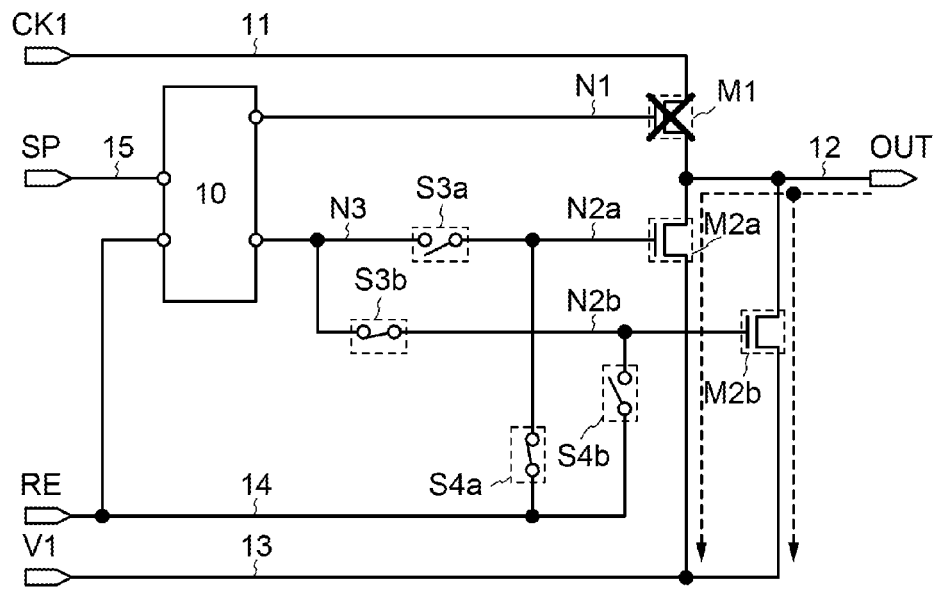
FIGS. 7A and 7B illustrate operations of the sequential circuit.
Figure 7B:
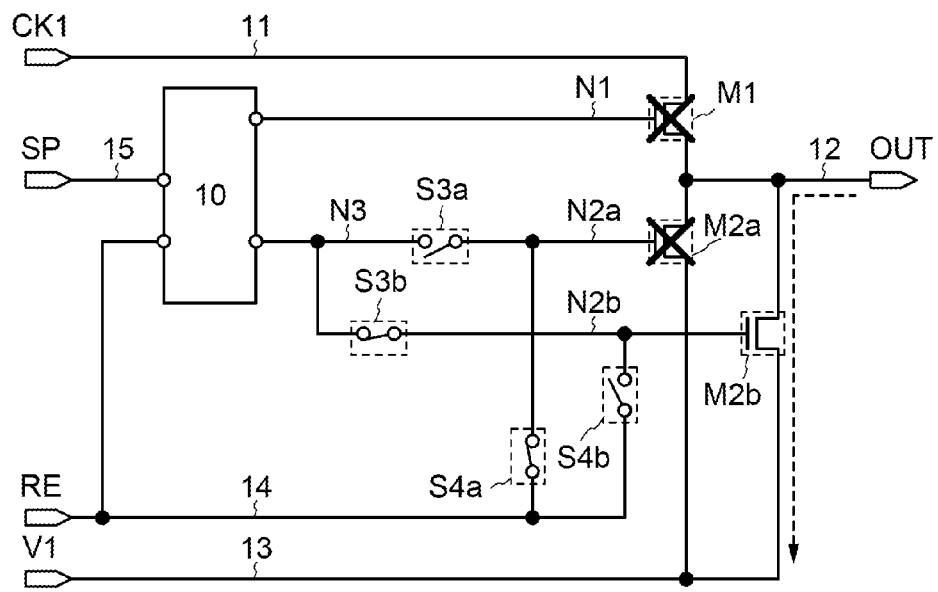

FIGS. 4A and 4B to FIGS. 7A and 7B are schematic diagrams of the operation of the sequential circuit of FIG. 1A in each period (step). The schematic diagram of FIG. 4A shows the operation of the sequential circuit of FIG. 1A in the period T1a, FIG. 4B shows that in the period T2a, FIG. 5A shows that in the period T3a, FIG. 5B shows that in the period T4a, FIG. 6A shows that in the period T1b, FIG. 6B shows that in the period T2b, FIG. 7A shows that in the period T3b, and FIG. 7B shows that in the period T4b.

First, operation in the period Ta is explained. In the period Ta, the switches S3a and S4b are on, and the switches S3b and S4a are off.

In the period T1a, the signal CK1 goes low, the signal SP goes high, and the signal RE goes low. A potential at which the transistor M1 is turned on is supplied from the circuit 10 to the node N1, thereby turning on the transistor M1. Then, the supply of the potential from the circuit 10 to the node N1 is stopped, thereby making the node N1 go into the floating state. Since the potential of the node N1 is maintained at the potential at which the transistor M1 is turned on, the transistor M1 remains on. A potential at which the transistor M2a is turned off is supplied from the circuit 10 to the node N2a via the switch S3a, thereby turning off the transistor M2a. Since the signal RE that is low is supplied to the node N2b via the switch S4b, the transistor M2b is turned off. Since the signal CK1 that is low is supplied to the wiring 12 via the transistor M1, the potential of the wiring 12 becomes the potential V1. That is, the signal OUT goes low.

In the period T2a, the signal CK1 goes high, the signal SP goes low, and the signal RE remains low. Since the supply of the potential from the circuit 10 to the node N1 is still stopped, the node N1 remains in the floating state and the transistor M1 remains on. Since the potential at which the transistor M2a is turned off is still supplied from the circuit 10 to the node N2a via the switch S3a, the transistor M2a remains off. Since the signal RE that remains low is still supplied to the node N2b via the switch S4b, the transistor M2b remains off. Since the signal CK1 that is high is kept being supplied to the wiring 12 via the transistor M1, the potential of the wiring 12 becomes the potential V2. That is, the signal OUT goes high.

Note that the potential of the node N1 rises as the potential of the wiring 12 rises, which is called bootstrap operation. This is because the node N1 is in the floating state and the transistor M1 maintains a potential difference between the wiring 12 and the node N1. Accordingly, the potential of the node N1 can have a value exceeding the sum of the potential of the first terminal of the transistor M1 (e.g., the potential V2) and the threshold voltage of the transistor M1, thereby rising the potential of the wiring 12 to the potential V2.

In the period T3a, the signal CK1 goes low, the signal SP remains low, and the signal RE goes high. The potential at which the transistor M1 is turned off is supplied from the circuit 10 to the node N1, thereby turning off the transistor M1. Further, the potential at which the transistor M2a is turned on is supplied from the circuit 10 to the node N2a through the switch S3a, thereby turning on the transistor M2a. Since the signal RE that is high is still supplied to the node N2b via the switch S4b, the transistor M2b is turned on. That is, both of the transistors M2a and M2b are turned on. Further, the potential V1 is supplied to the wiring 12 via both of the transistors M2a and M2b, thereby making the potential of the wiring 12 the potential V1. That is, the signal OUT goes low.

Note that since the potential V1 is supplied to the wiring 12 via both of the transistors M2a and M2b, the fall time of the signal OUT can be shortened without increasing W/L of the transistors M2a and M2b.

In the period T4a, the signal CK1 oscillates between high and low, the signal SP remains low, and the signal RE goes low. Since the potential at which the transistor M1 is turned off is still supplied from the circuit 10 to the node N1, the transistor M1 remains off. Since the potential at which the transistor M2a is turned on is still supplied from the circuit 10 to the node N2a through the switch S3a, the transistor M2a remains on. Since the signal RE that is low is still supplied to the node N2b via the switch S4b, the transistor M2b is turned off. Since the potential V1 is supplied to the wiring 12 via the transistor M2a, the potential of the wiring 12 remains the potential V1. That is, the signal OUT remains low.

Note that the period T4a is longer than the periods T1a, T2a, and T3a and occupies large part of the operation period. In addition, since the transistor M2b is off in the period T4a, the amount of time of on can be shortened, so that variation in characteristics of the transistor M2b can be suppressed.

Next, the operation in the period Tb will be described. In the period Tb, the switches S3a and S4b are off, and the switches S3b and S4a are on.

In the period T1b, the signal CK1 goes low, the signal SP goes high, and the signal RE goes low. A potential at which the transistor M1 is turned on is supplied from the circuit 10 to the node N1, thereby turning on the transistor M1. Then, the supply of the potential from the circuit 10 to the node N1 is stopped, thereby making the node N1 go into the floating state. Since the potential of the node N1 is maintained at the potential at which the transistor M1 is turned on, the transistor M1 remains on. A potential at which the transistor M2b is turned off is supplied from the circuit 10 to the node N2b via the switch S3b, thereby turning off the transistor M2a. Since the signal RE that is low is supplied to the node N2a via the switch S4a, the transistor M2a is turned off. Since the signal CK1 that is low is supplied to the wiring 12 via the transistor M1, the potential of the wiring 12 becomes the potential V1. That is, the signal OUT goes low.

In the period T2b, the signal CK1 goes high, the signal SP goes low, and the signal RE remains low. Since the supply of the potential from the circuit 10 to the node N1 is still stopped, the node N1 remains in the floating state and the transistor M1 remains on. Since the potential at which the transistor M2a is turned off is still supplied from the circuit 10 to the node N2b via the switch S3b, the transistor M2b remains off. Since the signal RE that remains low is still supplied to the node N2a via the switch S4a, the transistor M2a remains off. Since the signal CK1 that is high is kept being supplied to the wiring 12 via the transistor M1, the potential of the wiring 12 becomes the potential V2. That is, the signal OUT goes high.

Note that the potential of the node N1 rises as the potential of the wiring 12 rises, which is called bootstrap operation. This is because the node N1 is in the floating state and the transistor M1 maintains a potential difference between the wiring 12 and the node N1. Accordingly, the potential of the node N1 can have a value exceeding the sum of the potential of the first terminal of the transistor M1 (e.g., the potential V2) and the threshold voltage of the transistor M1, thereby rising the potential of the wiring 12 to the potential V2.

In the period T3b, the signal CK1 goes low, the signal SP remains low, and the signal RE goes high. The potential at which the transistor M1 is turned off is supplied from the circuit 10 to the node N1, thereby turning off the transistor M1. Further, the potential at which the transistor M2b is turned on is supplied from the circuit 10 to the node N2b via the switch S3b, thereby turning on the transistor M2b. Since the signal RE that is high is still supplied to the node N2a via the switch S4a, the transistor M2a is turned on. That is, both of the transistors M2a and M2b are turned on. Further, the potential V1 is supplied to the wiring 12 via both of the transistors M2a and M2b, thereby making the potential of the wiring 12 the potential V1. That is, the signal OUT goes low.

Note that since the potential V1 is supplied to the wiring 12 via both of the transistors M2a and M2b, the fall time of the signal OUT can be shortened without increasing W/L of the transistors M2a and M2b.

In the period T4b, the signal CK1 oscillates between high and low, the signal SP remains low, and the signal RE goes low. Since the potential at which the transistor M1 is turned off is still supplied from the circuit 10 to the node N1, the transistor M1 remains off. Since the potential at which the transistor M2b is turned on is still supplied from the circuit 10 to the node N2b via the switch S3b, the transistor M2b remains on. Since the signal RE that is low is still supplied to the node N2a via the switch S4a, the transistor M2a is turned off. Since the potential V1 is supplied to the wiring 12 via the transistor M2b, the potential of the wiring 12 remains the potential V1. That is, the signal OUT remains low.

Note that the period T4b is longer than the periods T1b, T2b, and T3b and occupies large part of the operation period. In addition, since the transistor M2a is off in the period T4b, the amount of time of on can be shortened, so that variation in characteristics of the transistor M2a can be suppressed.

As described above, with the sequential circuit of FIG. 1A, change in characteristics of a transistor and can be suppressed and the fall time of the signal OUT can be more shortened without increasing W/L of the transistor.

Note that the potential at which the transistor M1 is turned on means a value exceeding the sum of the potential of the first terminal or the second terminal of the transistor M1 (e.g., the potential V1) and the threshold voltage of the transistor M1. The potential at which the transistor M1 is turned off means a value smaller than the sum of the potential of the first terminal or the second terminal of the transistor M1 (e.g., the potential V1) and the threshold voltage of the transistor M1. The potential at which the transistor M1 is turned off is the potential V1, for example. The potential at which the transistor M2a or the transistor M2b is turned on means a value exceeding the sum of the potential of the first terminal of the transistor M2a or the transistor M2b (e.g., the potential V1) and the threshold voltage of the transistor M2a or the transistor M2b. The potential at which the transistor M2a or M2b is turned on is the potential V2, for example. The potential at which the transistor M2a or M2b is turned off means a value smaller than the sum of the potential of the first terminal of the transistor M2a or M2b (e.g., the potential V1) and the threshold voltage of the transistor M2a or M2b. The potential at which the transistor M2a or M2b is turned off is the potential V1, for example. Note that the potential at which the transistor M1 is turned off may be equal to or different from the potential at which the transistor M2a or the transistor M2b is turned off. The potential at which the transistor M2a is turned on may be equal to or different from the potential at which the transistor M2b is turned on. The potential at which the transistor M2a is turned off may be equal to or different from the potential at which the transistor M2b is turned off.

Note that the above-described operation is merely an example and operation is not limited to this. For example, the circuit 10 may supply the potential at which the transistor M2a is turned on to the node N2a in the period T1a, and the potential at which the transistor M2b is turned off to the N2b in the period T1b. In this case, in the period T1a, the transistor M2a is turned on and the potential V1 is supplied to the wiring 12 via the transistor M2a. In the period T1b, the transistor M2b is turned on and the potential V1 is supplied to the wiring 12 via the transistor M2b.

The circuit 10 may stop supply of the potential to the node N1 in the periods T4a and T4b. In this case, the node N1 goes into the floating state in the periods T4a and T4b.

Since the potential of the node N1 is maintained to the potential in the period T3a or the period T3b (i.e., the potential at which the transistor M1 is turned off), the transistor M1 remains off.

The circuit 10 may stop supply of the potential to the node N3 in the periods T4a and T4b. In this case, the node N3 and the node N2a go into the floating state in the periods T4a. Since the potential of the node N2a is maintained to the potential at which the transistor M2a is turned on, the transistor M2a remains on. Further, in the period T4b, the node N3 and the node N2b go into the floating state. Since the potential of the node N2b is maintained to the potential at which the transistor M2b is turned on, the transistor M2b remains on.

Note that it is preferable that W (channel width)/L (channel length) of the transistor M1 be the largest among those of the transistors included in the sequential circuit of FIG. 1A. For example, it is preferable that W/L of the transistor M1 be larger than W/L of the transistor M2a and W/L of the transistor M2b. In the case where the circuit 10 includes a transistor, it is preferable that W/L of the transistor M1 is larger than W/L of the transistor of the circuit 10.

Further, it is preferable that W/L of the transistor M2a be about equal to W/L of the transistor M2b. For example, it is preferable that W/L of the transistor M2a be within ±10% of W/L of the transistor M2b, further preferably within ±5%.

Note that W/L can be replaced with W in this specification and the like. This is because channel lengths of transistors are the same or about the same in many cases.

Note that it is preferable that switching between the period Ta and the period Tb be performed in the period T4a or the period T4b. Specifically, it is preferable that, in the period T4a, the switch S3a and the switch S4b be changed from on to off, and the switch S3b and the switch S4a change from off to on. It is preferable that, in the period T4b, the switch S3b and the switch S4a be changed from off to on, and the switch S3a and the switch S4b change from on to off. Thus, malfunction due to switching between the period Ta and the period Tb can be prevented.

After the switches S3a and S4b are changed from on to off, the switches S3b and S4a may be changed from off to on. Similarly, after the switches S3b and S4a are changed from on to off, the switches S3a and S4b may be changed from off to on. That is, a period during which the switches S3a, S3b, S4a, and S4b are all off may be provided. Thus, conduction between the fourth terminal of the circuit 10 and the wiring 14 can be prevented.

In addition, it is preferable that switching from the period Ta to the period Tb be performed after the periods T1a to T4a are repeated plural times (e.g., 100 times or more, preferably 200 times or more, further preferably 300 times or more). In addition, it is preferable that switching from the period Tb to the period Ta be performed after the periods T1b to T4b are repeated plural times (e.g., 100 times or more, preferably 200 times or more, further preferably 300 times or more). That is, it is preferable that the period Ta include any of the periods T1a to T4a plural times (e.g., 100 times or more, preferably 200 times or more, further preferably 300 times or more). It is preferable that the period Tb include any of the periods T1b to T4b plural times (e.g., 100 times or more, preferably 200 times or more, further preferably 300 times or more). Thus, increase in power consumption due to switching between the period Ta and the period Tb can be suppressed. Note that too much repeating might cause variation in the characteristics of the transistors M2a and M2b. For this reason, repeating time of the periods T1a to T4a or the periods T1b to T4b is preferably less than 1000 times, further preferably less than 700 times, still further preferably less than 500 times.

Figure 1B:
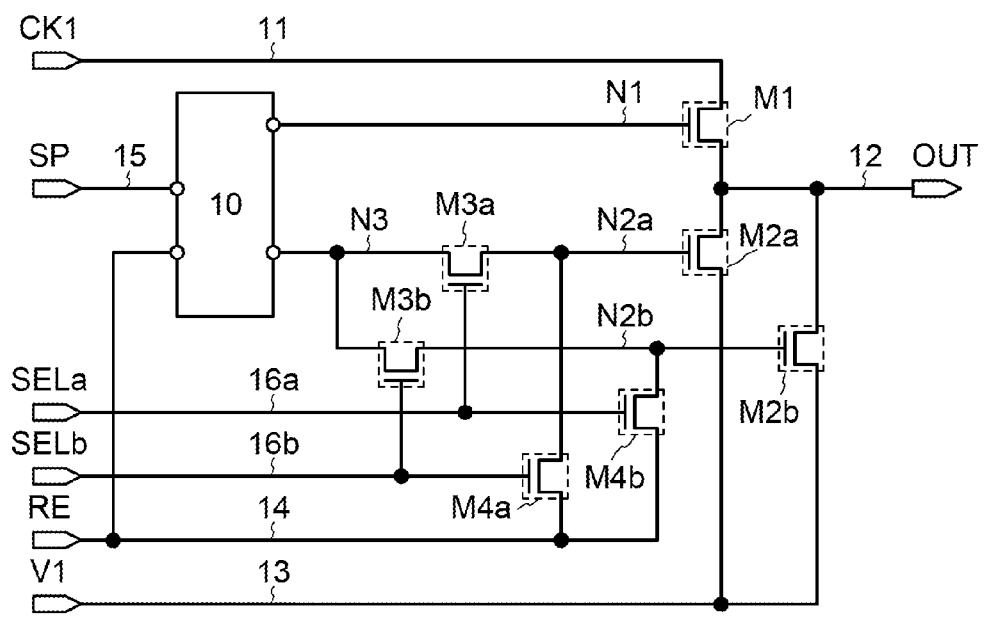

Note that a transistor can be applied as the switch. FIG. 1B shows a sequential circuit in which a transistor M3a, a transistor M3b, a transistor M4a, and a transistor M4b are employed as the switch S3a, the switch S3b, the switch S4a, and the switch S4b, respectively, in FIG. 1A. The transistors M3a, M3b, M4a, and M4b have the same polarity as the transistor M1. A first terminal of the transistor M3a is connected to the node N3, a second terminal of M3a is connected to the node N2a, and a gate of M3a is connected to a wiring 16a. A first terminal, a second terminal, and a gate of the transistor M3b are connected to the node N3, the node N2b, and a wiring 16b. A first terminal, a second terminal, and a gate of the transistor M4a are connected to the wiring 14, the node N2a, and the wiring 16b. A first terminal, a second terminal, and a gate of the transistor M4b are connected to the wiring 14, the node N2b, and the wiring 16a. It is preferable that the signal or the potential of the wiring 16a have a function of controlling on/off of the transistor M3a or the transistor M4b. It is preferable that the signal or the potential of the wiring 16b have a function of controlling on/off of the transistor M3b or the transistor M4a. In this embodiment, for convenience, a signal SELa and a signal SELb are input to the wiring 16a and the wiring 16b, respectively.

In the period Ta, the signal SELa is high and the signal SELb is low. Thus, the transistors M3a and M4b are on and the transistors M3b and M4a are off. In the period Tb, the signal SELa is low and the signal SELb is high. Thus, the transistors M3a and M4b are off and the transistors M3b and M4a are on. That is, on/off of the transistors M3a, M3b, M4a, and M4b is controlled at the same timing as on/off of the switches S3a, S3b, S4a, and S4b, respectively. Thus, the sequential circuit of FIG. 1B can operate similarly to the sequential circuit of FIG. 1A and thus have effects similar to those of the sequential circuit of FIG. 1A.

Note that low potentials of the signals SELa and SELb may be the potential V1. Note that they are not limited to this, a value less than the potential V1 may be used as low potentials of the signals SELa and SELb. Thus, a potential difference between a gate and a source of a transistor can be less than 0 V and variation in characteristics of the transistor can be suppressed as a result.

Note that high potentials of the signals SELa and SELb may be the potential V2. Note that they are not limited to this, a value more than the potential V2 may be used as high potentials of the signals SELa and SELb. Thus, the potentials of the nodes N2a and N2b can be higher.

Note that the signal SELb may be changed from low to high after the signal SELa is changed from high to low. In addition, the signal SELa may be changed from low to high after the signal SELb is changed from high to low. That is, a period during which the signal SELa and the signal SELb are both low may exist. Thus, conduction between the fourth terminal of the circuit 10 and the wiring 14 can be prevented.

Note that it is preferable that W/L of the transistor M3a be about equal to W/L of the transistor M3b. For example, it is preferable that W/L of the transistor M3a be within ±10% of W/L of the transistor M3b, further preferably within ±5%. In addition, it is preferable that W/L of the transistor M4a be about equal to W/L of the transistor M4b. For example, it is preferable that W/L of the transistor M4a be within ±10% of W/L of the transistor M4b, further preferably within ±5%. It is preferable that W/L of the transistor M1 be larger than W/L of the transistors M3a, M3b, M4a, and M4b. It is preferable that W/L of the transistors M2a and M2b be larger than W/L of the transistors M3a, M3b, M4a, and M4b. It is preferable that W/L of the transistors M4a and M4b be larger than W/L of the transistors M3a and M3b.

This embodiment can be implemented in appropriate combination with any of the structures described in the other embodiments and the like.

[Embodiment 2]

In this embodiment, a circuit that can be used as the circuit 10 of the sequential circuit in Embodiment 1 will be described.

Figure 8A:
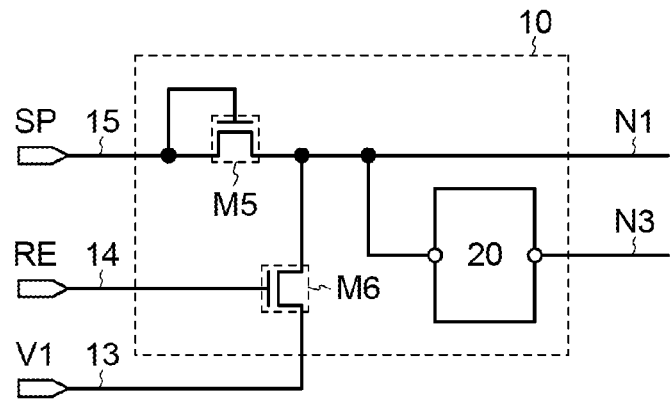
FIGS. 8A and 8B illustrate a configuration of a sequential circuit.

The circuit 10 of FIG. 8A includes a transistor M5, a transistor M6, and a circuit 20. The transistors M5 and M6 have the same polarity as the transistor M1. A first terminal and a gate of the transistor M5 are connected to the wiring 15, and a second terminal of M5 is connected to the node N1. A first terminal of the transistor M6 is connected to the wiring 13, a second terminal of M6 is connected to the node N1, and a gate of M6 is connected to the wiring 14. A first terminal and a second terminal of the circuit 20 are connected to the node N1 and the node N3, respectively.

The circuit 20 has a function of supplying a potential for controlling on/off of the transistor M2a or the transistor M2b to the node N3, in accordance with the potential of the node N1. Specifically, the circuit 20 has a function of supplying the potential at which the transistor M2a or the transistor M2b is turned on to the node N3 when the potential of the node N1 is low (e.g., in the period T3a, the period T3b, the period T4a, and the period T4b). Further, the circuit 20 has a function of supplying the potential at which the transistor M2a or the transistor M2b is turned off to the node N3 when the potential of the node N1 is high (e.g., in the period T1a, the period T1b, the period T2a, and the period T2b). The circuit 20 may be replaced with an inverter circuit in which an input terminal and an output terminal are connected to the node N1 and the node N3, respectively.

In the period T1a and the period T1b, the transistor M5 is turned on and the transistor M6 is turned off. Since the signal SP that is high is supplied to the node N1 through the transistor M5, the potential of the node N1 is increased. When the potential of the node N1 becomes a potential obtained by subtracting the threshold voltage of the transistor M5 from the gate potential (e.g., the potential V2) of the transistor M5, the transistor M5 is turned off. Thus, the node N1 goes into the floating state. In addition, the circuit 20 supplies the potential at which the transistor M2a or M2b is turned off to the node N3.

In the periods T2a and T2b, the transistors M5 and M6 remain off. Further, the circuit 20 still supplies the potential at which the transistor M2a or M2b is turned off to the node N3.

In the periods T3a and T3b, the transistor M5 remains off and the transistor M6 is turned on. Since the potential V1 is supplied to the node N1 through the transistor M6, the potential of the node N1 becomes the potential V1. Further, the circuit 20 supplies the potential at which the transistor M2a or M2b is turned on to the node N3.

In the periods T4a and T4b, the transistor M5 remains off and the transistor M6 is turned off. Further, the circuit 20 still supplies the potential at which the transistor M2a or M2b is turned on to the node N3.

Figure 8B:
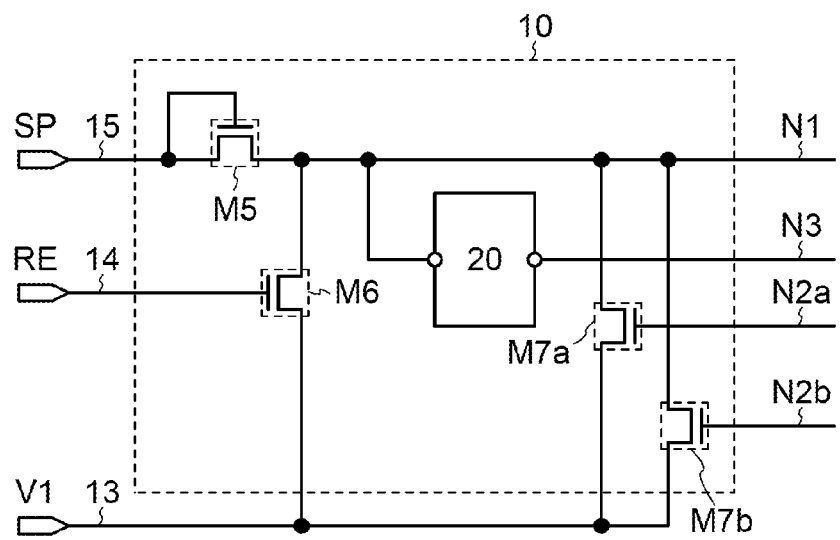

The circuit 10 of FIG. 8B is different from that of FIG. 8A in that a transistor M7a and a transistor M7b are included. The transistors M7a and M7b have the same polarity. A first terminal, a second terminal, and a gate of the transistor M7a are connected to the wiring 13, the node N1, and the node N2a, respectively. A first terminal, a second terminal, and a gate of the transistor M7b are connected to the wiring 13, the node N1, and the node N2b, respectively.

In the periods T1a, T2a, T1b, and T2b, the transistors M7a and M7b are off. In the periods T3a and T3b, the transistors M7a and M7b are on. In the period T4a, the transistor M7a is on and the transistor M7b is off. In the period T4b, the transistor M7a is off and the transistor M7b is on. In the circuit 10 of FIG. 8B, the potential V1 is supplied to the node N1 in the periods T3a, T4a, T3b, and T4b. This makes it easy to keep the potential of the node N1 at the potential V1.

Figure 9A:
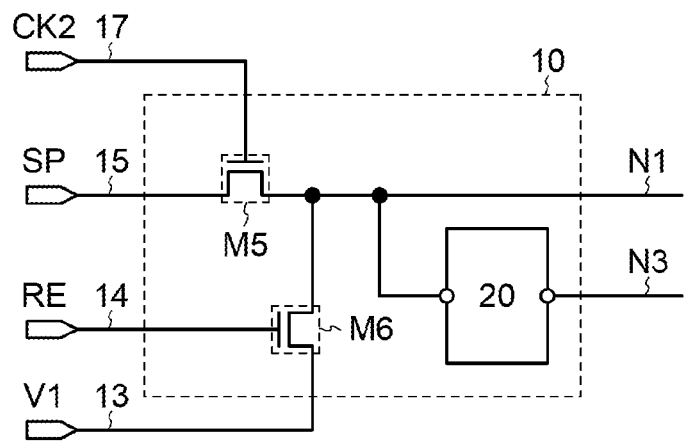
FIGS. 9A and 9B illustrate a configuration of a sequential circuit.

The circuit 10 of FIG. 9A is different from that of FIG. 8A in that the gate of the transistor M5 is connected to a wiring 17. It is preferable that the signal or the potential of the wiring 17 have a function of controlling on/off of the transistor M5. In this embodiment, for convenience, the signal CK2 is input to the wiring 17. Examples of the signal CK2 include an inverse signal of the signal CK1, a signal whose phase is different from that of the signal CK1, and the like. For example, the signal CK2 is high in the periods T1a and T1b, low in the periods T2a and T2b, high or low in the periods T3a and T3b, and repeats high and low in the periods T4a and T4b.

In the periods T1a and T1b, the transistor M5 is turned on, whereby the signal SP is supplied to the node N1 through the transistor M5. Since the signal SP is high, the potential of the node N1 is increased. Note that when the potential of the node N1 becomes a potential obtained by subtracting the threshold voltage of the transistor M5 from the gate potential (e.g., the potential V2) of the transistor M5, the transistor M5 is turned off. In the periods T2a and T2b, the transistor M5 is off. In the periods T3a and T3b, when the signal CK2 is high, the transistor M5 is on; thus, the signal SP is supplied to the node N1 through the transistor M5. On the other hand, when the signal CK2 is low, the transistor M5 is off. In the periods T4a and T4b, the transistor M5 repeats on and off. When the transistor M5 is on, the signal SP is supplied to the node N1 through the transistor M5. In the circuit 10 of FIG. 9A, the signal SP is supplied to the node N1 in the periods T4a and T4b. Since the signal SP is low, it is easier to keep the potential of the node N1 at the potential V1.

Figure 9B:
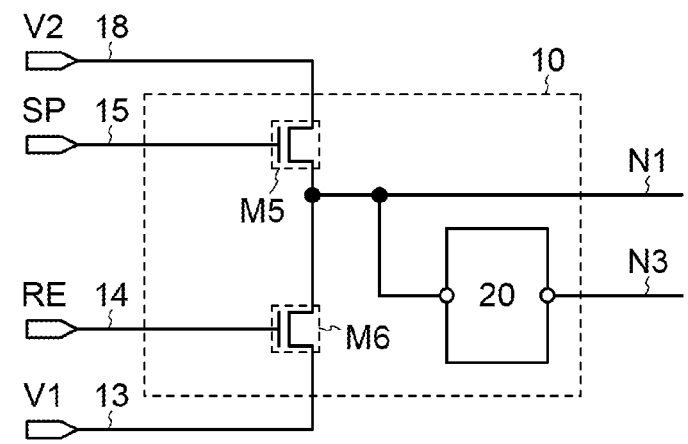

The circuit 10 of FIG. 9B is different from that of FIG. 8A in that the first terminal of the transistor M5 is connected to a wiring 18. The signal or the potential of the wiring 18 has a function of turning on the transistor M1. In this embodiment, the potential V2 is supplied to the wiring 18, for convenience.

In the periods T1a and T1b, the transistor M5 is on; thus, the potential V2 is supplied to the node N1 through the transistor M5 and the potential of the node N1 is increased as a result. When the potential of the node N1 has a value obtained by subtracting the threshold voltage of the transistor M5 from the gate potential (e.g., potential V2) of the transistor M5, the transistor M5 is turned off. In the periods T2a to T4a and the periods T2b to T4b, the transistor M5 is off. In the circuit 10 of FIG. 9B, the potential V2 is supplied to the node N1 in the periods T1a and T1b. Thus, current flowing through the wiring 15 can be made small.

Note that in FIG. 8B, the gate of the transistor M5 may be connected to the wiring 17 as in FIG. 9A, and the first terminal of the transistor M5 may be connected to the wiring 18 as in FIG. 9B. Particularly in FIG. 8B, when the gate of the transistor M5 is connected to the wiring 17, the potential V1 supplied to the node N1 through the transistor M7a or M7b is supplied to the wiring 15 through the transistor M5, in the periods T4a and T4b. This makes it easy to keep the potential of the wiring 15 at the potential V1.

Note that in FIGS. 8A and 8B, and FIG. 9B, the first terminal of the transistor M5 may be connected to the wiring 17. Thus, the potential of the first terminal of the transistor M5 is decreased in the period T1a, part of the period T4a, the period T1b, or part of the period T4b, and the like, so that variation in characteristics of the transistor M5 can be suppressed.

Note that in FIGS. 8A and 8B and FIG. 9B, another transistor in which a first terminal, a second terminal, and a gate are connected to the wiring 15, the node N1, and the wiring 17, respectively may be provided, so that an effect similar to that in the circuit 10 of FIG. 9A can be attained.

Note that in FIGS. 8A and 8B and FIG. 9A, another transistor in which a first terminal, a second terminal, and a gate are connected to the wiring 18 or 17, the node N1, and the wiring 15, respectively may be provided, so that an effect similar to that in the circuit 10 of FIG. 9B can be attained.

Note that the transistor M6 can be omitted when the transistor in which the first terminal, the second terminal, and the gate of the circuit 10 are connected to the wiring 15, the node N1, and the wiring 17, respectively is provided as in FIG. 9A.

Note that in the above-described circuit 10, the first terminal of the transistor M6 may be connected to the wiring 11.

Note that in the above-described circuit 10, the first terminal of the circuit 20 may be connected to the wiring 12.

Note that in the above-described circuit 10, the first terminal and the second terminal of the transistor M6 may be connected to the wiring 18 or 17 and the node N3, respectively. Alternatively, another transistor in which a first terminal, a second terminal, and a gate are connected to the wiring 18 or 17, the node N3, and the wiring 14, respectively may be provided. Further alternatively, another transistor in which a first terminal, a second terminal, and a gate are connected to the wiring 18 or 17, the node N2a, and the wiring 14, respectively; and another transistor in which a first terminal, a second terminal, and a gate are connected to the wiring 18 or 17, the node N2b, and the wiring 14, respectively may be provided.

Next, a circuit which can be employed as the circuit 20 will be described.

Figure 10A:
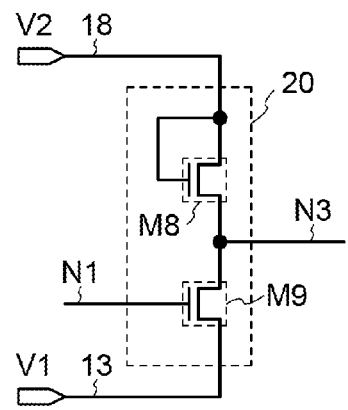
FIGS. 10A to 10C illustrate a configuration of a sequential circuit.

A circuit 20 of FIG. 10A includes a transistor M8 and a transistor M9. The transistors M8 and M9 have the same polarity as the transistor M1. A first terminal, a second terminal, and a gate of the transistor M8 are connected to the wiring 18, the second terminal of the circuit 20, and the wiring 18, respectively. A first terminal, a second terminal, and a gate of the transistor M9 are connected to the wiring 13, the second terminal of the circuit 20, and the first terminal of the circuit 20, respectively. In the periods T1a, T2a, T1b, and T2b, the transistors M8 is on and the transistor M9 is off. In the periods T3a, T4a, T3b, and T4b, the transistors M8 is on and then is turned off, and the transistor M9 is off.

Note that the first terminal of the transistor M8 may be connected to the wiring 11 or the wiring 17. The gate of the transistor M8 may be connected to the wiring 11 or 17. Both of the first terminal and the gate of the transistor M8 may be connected to the wiring 11 or 17.

Figure 10B:
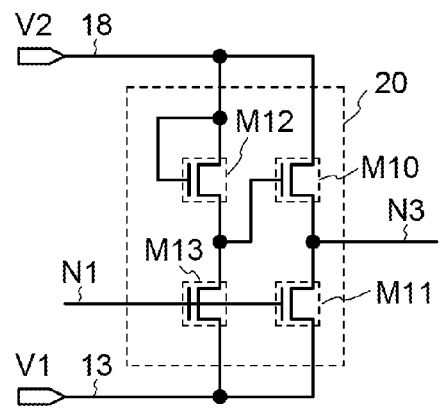

The circuit 20 of FIG. 10B includes transistors M10 to M13. The transistors M10 to M13 have the same polarity as the transistor M1. A first terminal and a second terminal of the transistor M10 are connected to the wiring 18 and the second terminal of the circuit 20, respectively. A first terminal, a second terminal, and a gate of the transistor M11 are connected to the wiring 13, the second terminal of the circuit 20, and the first terminal of the circuit 20, respectively. A first terminal, a second terminal, a gate of the transistor M12 are connected to the wiring 18, a gate of the transistor M10, and the wiring 18, respectively. A first terminal, a second terminal, a gate of the transistor M13 are connected to the wiring 13, the gate of the transistor M10, and the first terminal of the circuit 20, respectively. In the periods T1a, T2a, T1b, and T2b, the transistors M10 is off, the transistor M11 is on, the transistor M12 is on, and the transistor M13 is on. In the periods T3a, T4a, T3b, and T4b, the transistors M10 is on, the transistor M11 is off, the transistor M12 is on and then is turned off, and the transistor M13 is off.

Note that each of the first terminals of the transistors M10 and M12 and the gate of the transistor M12 may be connected to the wiring 11 or 17. In that case, the signal repeating high and low can be output from the circuit 20 in the periods T4a and T4b. Therefore, variation in characteristics of the transistors M2a and M2b can be suppressed.

Figure 10C:
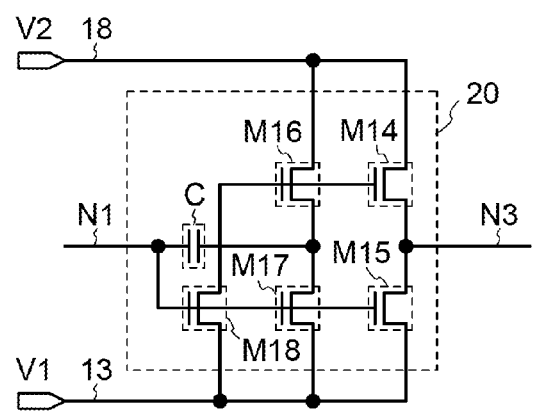

The circuit 20 of FIG. 10C includes transistors M14 to M18 and a capacitor C. The transistors M14 to M18 have the same polarity as the transistor M1. A first terminal and a second terminal of the transistor M14 are connected to the wiring 18 and the second terminal of the circuit 20, respectively. A first terminal, a second terminal, and a gate of the transistor M15 are connected to the wiring 13, the second terminal of the circuit 20, and the first terminal of the circuit 20, respectively. A first terminal and a gate of the transistor M16 are connected to the wiring 18 and a gate of the transistor M14, respectively. A first terminal, a second terminal, a gate of the transistor M17 are connected to the wiring 13, the second terminal of the transistor M16, and the first terminal of the circuit 20, respectively. A first terminal, a second terminal, a gate of the transistor M18 are connected to the wiring 13, the gate of the transistor M14, and the first terminal of the circuit 20, respectively. A first electrode and a second electrode of the capacitor C are connected to the first terminal of the circuit 20 and the second terminal of the transistor M16, respectively. In the periods T1a, T2a, T1b, and T2b, the transistors M14 is off, the transistor M15 is on, the transistor M16 is off, the transistor M17 is on, and the transistor M18 is on. In the periods T3a, T4a, T3b, and T4b, the transistors M14 is on, the transistor M15 is off the transistor M16 is on, the transistor M17 is off, and the transistor M18 is off. In the circuit 20 of FIG. 10C, the transistors M14 and M16 are turned on using capacitive coupling of the capacitor C in the periods T3a and T3b; thus, the rise time of the potential of the second terminal of the circuit 20 can be shortened. Therefore, timing of turning on the transistor M2a or M2b can be earlier and thus the fall time of the signal OUT can be more shortened.

This embodiment can be implemented in appropriate combination with any of the structures described in the other embodiments.

[Embodiment 3]

In this embodiment, a shift register circuit including the sequential circuit according to one embodiment of the present invention will be described.

Figure 11:
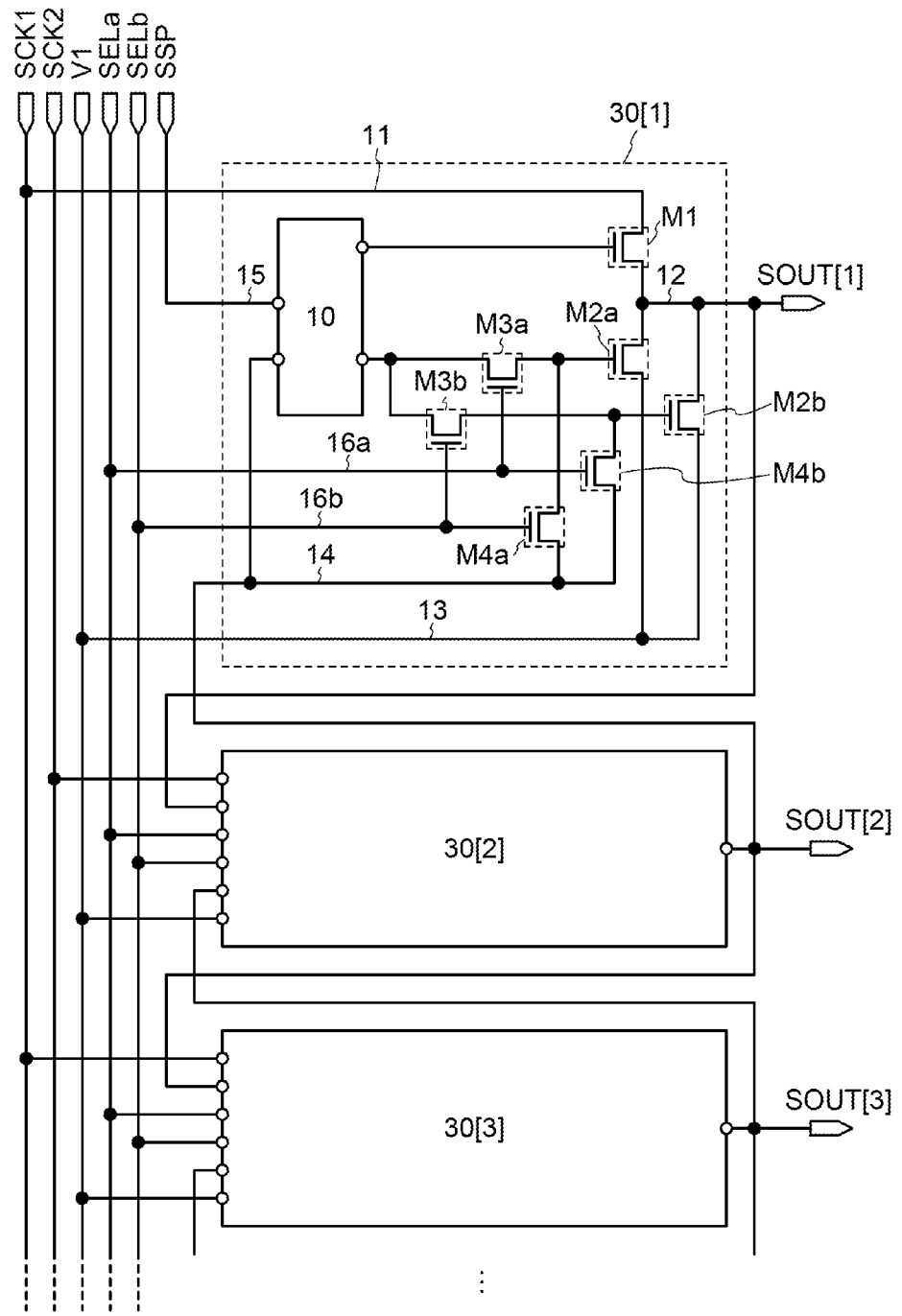
FIG. 11 illustrates a structure of a shift register.

FIG. 11 is a circuit diagram of the shift register circuit of this embodiment. The shift register circuit of FIG. 11 includes N (N is a natural number greater than or equal to 3) sequential circuits 30. Note that FIG. 11 illustrates only the sequential circuits 30[1] to 30[3].

The sequential circuit of FIG. 1B is employed as each of the sequential circuits 30 of the shift register circuit of FIG. 11. In the sequential circuit 30[i] (i is greater than or equal to 2 and less than or equal to N−1), a signal SOUT[i−1] is input to the wiring 15, the signal SELa is input to the wiring 16a, the signal SELb is input to the wiring 16b, a signal SOUT[i+1] is input to the wiring 14, the potential V1 is input to the wiring 13, and a signal SOUT[i] is output from the wiring 12. In the sequential circuit 30 in an odd-number stage, a signal SCK1 is input to the wiring 11, whereas in the sequential circuit 30 in an even-numbered stage, a signal SCK2 is input to the wiring 11. The sequential circuit 30[1] is different from the sequential circuit 30[i] in that a signal SSP is input to the wiring 11. The sequential circuit 30[N] is different from the sequential circuit 30[i] in that a reset signal of the signal SSP is input to the wiring 14.

The signal SCK1 is similar to the signal CK1. The signal SCK2 is similar to the signal CK2. The signal SSP is a start pulse of a shift register circuit and is similar to the signal SP. The signal SOUT is similar to the signal OUT.

Note that when the circuit 10 has a structure in which the wiring 17 is connected as in FIG. 9A, the signal SCK2 is input to the wiring 17 in the sequential circuit 30 in an odd-numbered stage, and the signal SCK1 is input to the wiring 17 in the sequential circuit 30 in an even-numbered stage.

Note that when the circuit 10 has a structure in which the wiring 18 is connected as in FIG. 9B, the potential V2 is supplied to the wiring 18 in each of the sequential circuits 30.

This embodiment can be implemented in appropriate combination with any of the structures described in the other embodiments

[Embodiment 4]

In this embodiment, an example of the configuration of a panel in which a liquid crystal element is used as a display element will be described.

Figure 12A:
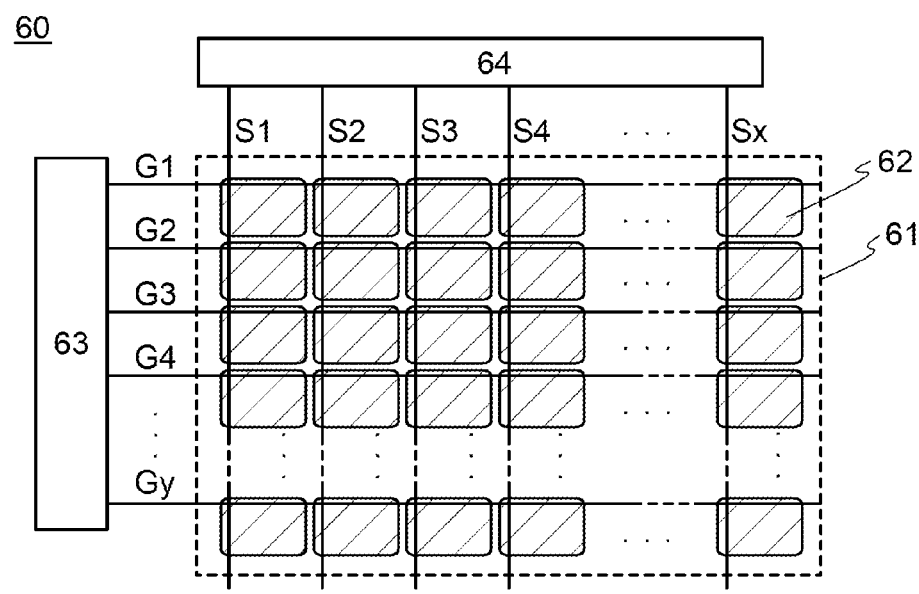
FIGS. 12A and 12B illustrate a structure of a panel.

The panel 60 shown in FIG. 12A includes a pixel portion 61, a scan line driver circuit 63, and a signal line driver circuit 64. The pixel portion 61 includes a plurality of pixels 62, a plurality of scan lines G for selecting the pixels 62 on a row basis, and a plurality of signal lines S for supplying image signals to the selected pixels 62. Each of the plurality of pixels 62 is connected to at least one of the scan lines G and at least one of the signal lines S. The scan line driver circuit 63 outputs a signal to the scan lines G. The signal line driver circuit 64 outputs a pixel signal to the signal lines S.

The scan line driver circuit 63 includes a shift register circuit. An output signal of the shift register circuit is sequentially input to the scan lines G. The sequential circuit according to one embodiment of the present invention can be used as the shift register circuit of the scan line driver circuit 63.

Note that the kinds and number of wirings provided in the pixel portion 61 depend on the configuration, number, and arrangement of the pixels 62. Specifically, in the pixel portion 61 illustrated in FIG. 12A, the pixels 62 are arranged in a matrix of x rows and y columns, and the signal lines S1 to Sx and the scan lines G1 to Gy are provided in the pixel portion 61.

Figure 12B:
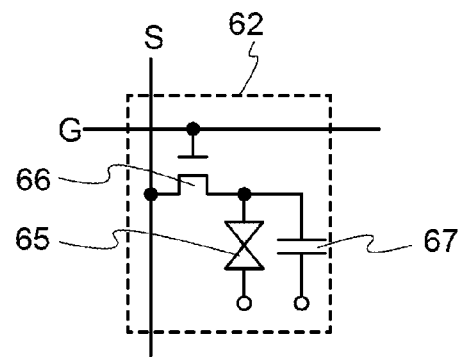

FIG. 12B is a structure example of the pixel 62. The pixel 62 includes a liquid crystal element 65, a transistor 66, and a capacitor 67. The liquid crystal element 65 includes a first electrode (also referred to as pixel electrode), a second electrode (also referred to as counter electrode), and a liquid crystal layer including a liquid crystal material to which the voltage between the first electrode and the second electrode is applied. One of a source and a drain of the transistor 66 is connected to any one of signal lines S1 to Sx, the other thereof is connected to the first electrode of the liquid crystal element 65, and a gate is connected to any one of scan lines G1 to Gy. The transistor 66 has a function of controlling conduction/non-conduction between the signal line S and the first electrode of the liquid crystal element 65. A first electrode of the capacitor 67 is connected to the first electrode of the liquid crystal element 65, and a second electrode of the capacitor 67 is connected to a capacitor line (not shown). The capacitor 67 has a function of holding a potential difference between the first electrode of the liquid crystal element 65 and the capacitor line.

Note that the second electrode of the liquid crystal element 65 may be shared by each pixel 62. The second electrode of the capacitor 67 in each pixel 62 may be connected to one capacitor line. A common potential which is the same as the potential of the second electrode of the liquid crystal element 65 may be supplied to the capacitor line.

Note that the pixel 62 may further include another circuit element such as a transistor, a diode, a resistor, a capacitor, or an inductor as needed.

In one embodiment of the present invention, in the pixel 62, a transistor whose off-state current is small is preferably used as a switch for holding electric charge accumulated in the liquid crystal element 65 and the capacitor 67. Specifically, in the case of the pixel 62 illustrated in FIG. 12B, electric charge can be prevented from leaking through the transistor 66 when the off-state current of the transistor 66 is small. Therefore, the potential of an image signal supplied to the liquid crystal element 65 and the capacitor 67 can be held more reliably, and thus a change in the transmittance of the liquid crystal element 65 due to leakage of electric charge can be prevented in one frame period. As a result, the quality of a displayed image can be improved. Further, since leakage of electric charge through the transistor 66 can be prevented when the off-state current of the transistor 66 is small, the area of the capacitor 67 can be made small. Accordingly, the transmittance of the panel 60 can be improved, and thus the loss of light supplied from a light supply portion such as a back light or a front light in the panel 60 can be reduced. As a result, power consumption of a liquid crystal display device can be reduced.

The panel in which the liquid crystal element is used as a display element is described in this embodiment; however, a light-emitting element may be used as a display element. Examples of a light-emitting element include an element whose luminance is controlled by current or voltage, such as a light-emitting diode (LED) or an organic light-emitting diode (OLED). For example, an OLED includes at least an EL layer, an anode, and a cathode. The EL layer is formed using a single layer or a plurality of layers between the anode and the cathode, at least one of which is a light-emitting layer containing a light-emitting substance. From the EL layer, electroluminescence is obtained by current supplied when a potential difference between the cathode and the anode is higher than or equal to the threshold voltage Vth of the light-emitting element. As electroluminescence, there are luminescence (fluorescence) at the time of returning from a singlet-excited state to a ground state and luminescence (phosphorescence) at the time of returning from a triplet-excited state to a ground state.

By using the sequential circuit according to one embodiment of the present invention as the scan line driver circuit 63, the fall time of the signal of the scan line G can be shortened. Thus, an image signal corresponding to another row is prevented from being inputted to the pixel 62, which leads to holding a more correct image signal and improving display quality.

Note that in the case where the sequential circuit according to one embodiment of the present invention is used as the scan line driver circuit 63, it is preferable that the transistor 66 included in the pixel 62 has the same polarity as the transistor M1. In addition, it is preferable that the transistor provided over the same substrate as the scan line driver circuit 63 have the same polarity as the transistor M1.

This example can be implemented in appropriate combination with any of the structures described in the other embodiments and examples.

[Embodiment 5]

In a semiconductor device according to one embodiment of the present invention, a transistor may include a channel formation region in a semiconductor film of amorphous, microcrystalline, polycrystalline, or single crystal silicon, germanium, or the like. Alternatively, the transistor may include a channel formation region in a semiconductor film whose bandgap is wider than that of silicon and whose intrinsic carrier density is lower than that of silicon.

As silicon, any of the following can be used: amorphous silicon formed by a sputtering method or a vapor deposition method such as a plasma CVD method; polycrystalline silicon obtained in such a manner that amorphous silicon is crystallized by laser annealing or the like; single crystal silicon obtained in such a manner that a surface portion of a single crystal silicon wafer is separated by implantation of hydrogen ions or the like into the silicon wafer; and the like.

A purified oxide semiconductor (purified OS) obtained by reduction of impurities such as moisture or hydrogen which serves as an electron donor (donor) and by reduction of oxygen defects is an intrinsic (i-type) semiconductor or a substantially i-type semiconductor. For this reason, a transistor having a channel formation region in a highly purified oxide semiconductor film has extremely small off-state current and high reliability.

Specifically, various experiments can prove a small off-state current of a transistor having a channel formation region in a highly purified oxide semiconductor. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In this case, it can be seen that the off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a purified oxide semiconductor film has been used for a channel formation region of the transistor, and the off-state current of the transistor has been measured from a change in the amount of charge of the capacitor per unit time. As a result, it was found that, in the case where the voltage between the source electrode and the drain electrode of the transistor is 3 V, a lower off-state current of several tens of yA/μm is obtained. Accordingly, the off-state current of the transistor in which the purified oxide semiconductor film is used as a channel formation region is considerably lower than that of a transistor in which silicon having crystallinity is used.

Unless otherwise specified, in the case of an n-channel transistor, off-state current in this specification is current which flows between a source and a drain when the potential of the drain is higher than that of the source and that of a gate while the potential of the gate is lower than or equal to zero when a reference potential is the potential of the source. Moreover, in the case of a p-channel transistor, the off-state current in this specification is a current that flows between a source and a drain when the potential of a gate is higher than or equal to 0 with the potential of the source as a reference potential while the potential of the drain is lower than those of the source and the gate.

Next, an example of a transistor including a channel formation region in an oxide semiconductor film is described with reference to drawings.

Figure 13A:
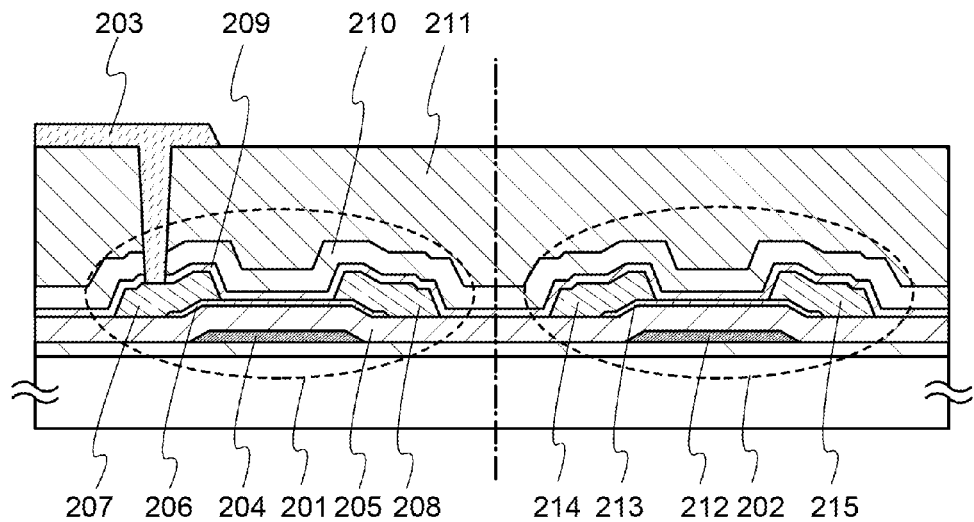
FIGS. 13A and 13B are cross-sectional views illustrating a structure of a transistor.

FIG. 13A illustrates an example of a cross-sectional structure of a transistor 201 provided in a pixel and a transistor 202 provided in a driver circuit.

The transistor 201 in FIG. 13A includes a conductive film 204 that is provided over an insulating surface and functions as a gate, an insulating film 205 over the conductive film 204, a semiconductor film 206 that overlaps with the conductive film 204 over the insulating film 205, and conductive films 207 and 208 that are provided over the semiconductor film 206 and function as a source and a drain. In FIG. 13A, insulating films 209 and 210 are sequentially stacked over the semiconductor film 206 and the conductive films 207 and 208. The transistor 201 may include the insulating films 209 and 210. The insulating film 211 formed using a resin is provided over the insulating films 209 and 210. An opening is provided in the insulating films 209, 210, and 211, and the conductive film 203 that is connected to the conductive film 207 through the opening is provided over the insulating film 211.

Note that the conductive film 203 functions as a first electrode of a display element. For example, a liquid crystal element includes a first electrode and a second electrode, and a liquid crystal layer to which an electric field is applied by the first electrode and the second electrode. Thus, in the case where the liquid crystal element is formed over the transistor 201, in addition to the conductive film 203, a liquid crystal layer and a conductive film functioning as the second electrode may be provided over the insulating film 211. When the display element is an OLED, in addition to the conductive film 203 functioning as one of an anode and a cathode, an EL layer and a conductive film functioning as the other of the anode the cathode and may be provided over the insulating film 211.

The use of a resin for the insulating film 211 can prevent generation of unevenness on a surface where the conductive film 203 is formed, that is, can increase the flatness of the surface where the conductive film 203 is formed. Specifically, an organic material such as an acrylic resin, an epoxy resin, a benzocyclobutene-based resin, polyimide, or polyamide can be used for the insulating film 211. As an alternative to the organic material, it is possible to use a silicone resin or the like. Note that the insulating film 211 having higher flatness can be formed by stacking a plurality of insulating films formed using these materials.

Specifically, for the conductive film 203, any of indium oxide, indium oxide-tin oxide (indium tin oxide (ITO)), indium oxide-tin oxide containing silicon or silicon oxide, indium oxide-zinc oxide (indium zinc oxide), indium oxide containing tungsten oxide and zinc oxide, an Al—Zn-based oxide semiconductor containing nitrogen, a Zn-based oxide semiconductor containing nitrogen, a Sn—Zn-based oxide semiconductor containing nitrogen, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. Other examples are elements that belong to Group 1 or 2 in the periodic table, for example, an alkali metal such as lithium (Li) or cesium (Cs) and an alkaline earth metal such as magnesium (Mg), calcium (Ca), or strontium (Sr), an alloy containing such an element (e.g., MgAg or AlLi), a rare earth metal such as europium (Eu) or ytterbium (Yb), and an alloy containing such an element. Note that the conductive film 203 can be formed in such a manner that, for example, a conductive film is formed using the above material by sputtering or evaporation, and then the conductive film is processed into a desired shape by etching through a photolithography process.

The transistor 202 in FIG. 13A includes a conductive film 212 that is provided over an insulating surface and functions as a gate, the insulating film 205 over the conductive film 212, a semiconductor film 213 that overlaps with the conductive film 212 over the insulating film 205, and conductive films 214 and 215 that are provided over the semiconductor film 213 and function as a source and a drain. In FIG. 13A, the insulating films 209 and 210 are sequentially stacked over the semiconductor film 213 and the conductive films 214 and 215. An insulating film 211 formed using a resin is provided over the insulating films 209 and 210.

Note that in FIG. 13A, a conductive film functioning as a back gate of the transistor 202 included in the driver circuit may be formed over the insulating film 211 together with the conductive film 203 functioning as the electrode of the liquid crystal element in the pixel. With the above structure, the conductive film 203 and the conductive film functioning as the back gate can be formed by processing one conductive film into a desired shape by etching or the like. Accordingly, the conductive film functioning as the back gate can be provided without an increase in the steps of manufacturing a semiconductor device. The back gate may be floating or may be supplied with a potential from another element. In the latter case, potentials at the same level may be applied to a normal gate (front gate) and the back gate, or a fixed potential such as a ground potential may be applied only to the back gate. By controlling the potential applied to the back gate, the threshold voltage of the transistor 202 can be controlled. By providing the back gate, a channel formation region is enlarged and the drain current can be increased. Moreover, providing the back gate facilitates formation of a depletion layer in the semiconductor film, which results in lower subthreshold swing.

In FIG. 13A, the insulating films 209 and 210 are provided between the semiconductor films 206 and 213 and the insulating film 211. However, the number of insulating films provided between the semiconductor films 206 and 213 and the insulating film 211 may be one, or may be three or more.

The insulating film 210 preferably contains oxygen at a proportion higher than or equal to the stoichiometric composition and has a function of supplying part of oxygen to the semiconductor film 206 by heating. In addition, the insulating film 210 preferably has a few defects, typically, the spin density of a signal that appears at g=2.001 due to a dangling bond of silicon is $1 \times 10^{18}$ spins/cm$^3$ or lower when measured by ESR. Note that in the case where the semiconductor film 206 is damaged at the time of formation of the insulating film 210 when the insulating film 210 is directly formed on the semiconductor films 206 and 213, the insulating film 209 is preferably provided between the semiconductor films 206 and 213 and the insulating film 210, as illustrated in FIG. 13A. The insulating film 209 preferably causes little damage to the semiconductor film 206 when the insulating film 209 is formed compared to the case of the insulating film 210 and has a function of passing oxygen. If damage to the semiconductor films 206 and 213 can be reduced and the insulating film 210 can be formed directly on the semiconductor films 206 and 213, the insulating film 209 is not necessarily provided.

The number of defects in the insulating film 209 is preferably small; typically, the spin density of a signal that appears at g=2.001 due to a dangling bond of silicon is preferably $3 \times 10^{17}$ spins/cm$^3$ or lower when measured by ESR. This is because if the density of defects in the insulating film 209 is high, oxygen is bonded to the defects and the amount of oxygen that passes through the insulating film 209 is decreased.

Further, an interface between the insulating film 209 and the semiconductor films 206 and 213 preferably has a few defects, typically, the spin density of a signal that appears at g=1.93 due to oxygen vacancies in an oxide semiconductor used for the semiconductor films 206 and 213 is lower than or equal to $1 \times 10^{17}$ spins/cm$^3$, preferably lower than or equal to the measurement limit when measured by ESR where a magnetic field is applied parallel to a film surface.

Specifically, as the insulating film 209 or the insulating film 210, a silicon oxide film or a silicon oxynitride film can be used.

Figure 13B:
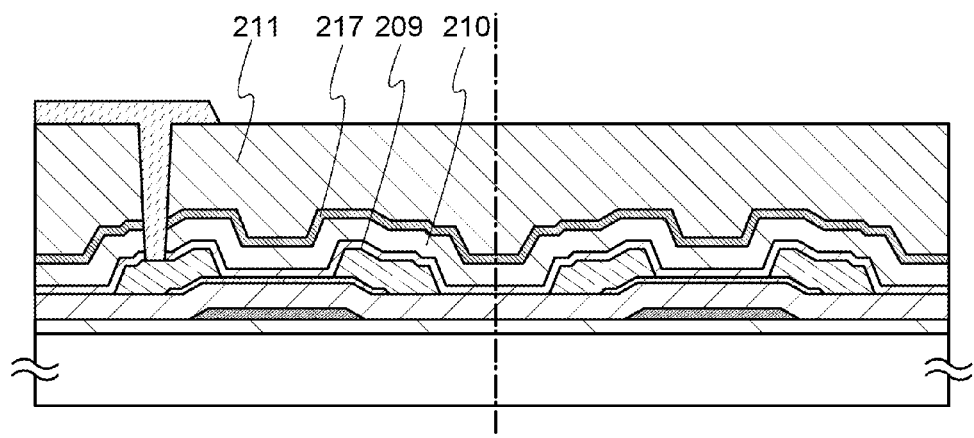

Next, FIG. 13B illustrates a cross-sectional structure of the transistor 201, the conductive film 203 connected to the transistor 201, and the transistor 202 in the case where an insulating film 217 is further provided between the insulating films 210 and 211 in the cross-sectional structure in FIG. 13A. The insulating film 217 preferably has an effect of blocking diffusion of oxygen, hydrogen, and water. Alternatively, the insulating film 217 preferably has an effect of blocking diffusion of hydrogen and water.

As an insulating film has higher density and becomes denser or has a fewer dangling bonds and becomes more chemically stable, the insulating film has a higher blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 217 has an effect of blocking diffusion of water, hydrogen, and the like, impurities such as water and hydrogen that exist in the insulating film 211 formed using a resin or exist outside the panel can be prevented from entering the semiconductor film 206 or 213. In the case where an oxide semiconductor is used for the semiconductor film 206 or 213, part of water or hydrogen entering the oxide semiconductor serves as an electron donor. Thus, the use of the insulating film 217 having the blocking effect can prevent shifts in threshold voltages of the transistors 201 and 202 due to generation of donors.

In the case where an oxide semiconductor is used for the semiconductor film 206 or 213, when the insulating film 217 has an effect of blocking diffusion of oxygen, diffusion of oxygen from the oxide semiconductor into the outside can be prevented. Accordingly, oxygen vacancies in the oxide semiconductor that serve as donors are reduced, so that shifts in threshold voltages of the transistors 201 and 202 due to generation of donors can be prevented.

In the case where adhesion of the insulating films 217 and 211 is higher than that of the insulating films 210 and 211, the use of the insulating film 217 can prevent separation of the insulating film 211.

In the case where an oxide semiconductor film is used as each of the semiconductor film 206 and the semiconductor film 213, at least indium (In) or zinc (Zn) is preferably included as an oxide semiconductor. The oxide semiconductor preferably contains, in addition to In and Zn, gallium (Ga) serving as a stabilizer that reduces variations in electrical characteristics among transistors using the above-described oxide. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn-based oxide, a transistor with favorable electrical characteristics can be formed over a glass substrate. Further, a larger substrate can be used.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn, and there is no limitation on the ratio of In, Ga, and Zn. In addition, the In—Ga—Zn—O-based oxide may contain a metal element other than In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

For example, with an In—Sn—Zn-based oxide, high mobility can be realized relatively easily. However, even with an In—Ga—Zn-based oxide, mobility can be increased by reducing the defect density in the bulk.

Note that in one embodiment of the present invention, an oxide semiconductor film in a single crystal state, a polycrystalline (also referred to as polycrystal) state, an amorphous state, or the like can be used in the transistor. Preferably, a CAAC-OS (c-axis aligned crystalline oxide semiconductor) film can be used as the oxide semiconductor film.

The CAAC-OS film is not completely single crystal nor completely amorphous.

Note that in most cases, crystal part included in the CAAS-OS film fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Each of the semiconductor film 206 and the semiconductor film 213 may be a stack of a plurality of oxide semiconductor films formed using metal oxide targets with different atomic ratios of metals. For example, the semiconductor stack may be formed in such a manner that a first oxide semiconductor film is formed using a target with an atomic ratio of In:Ga:Zn of 1:1:1 and a second oxide semiconductor film is formed using a target with an atomic ratio of In:Ga:Zn of 3:1:2. Alternatively, the semiconductor stack may be formed in such a manner that a first oxide semiconductor film, a second oxide semiconductor film, and a third oxide semiconductor film are formed with targets having an atomic ratio of In:Ga:Zn of 1:3:2, 3:1:2, and 1:1:1, respectively.

Alternatively, each of the semiconductor film 206 and the semiconductor film 213 may be a stack of a plurality of oxide semiconductor films formed using metal oxide targets containing different metals.

This embodiment can be implemented in appropriate combination with any of the structures described in the other embodiments.

[Embodiment 6]

Figure 14A:
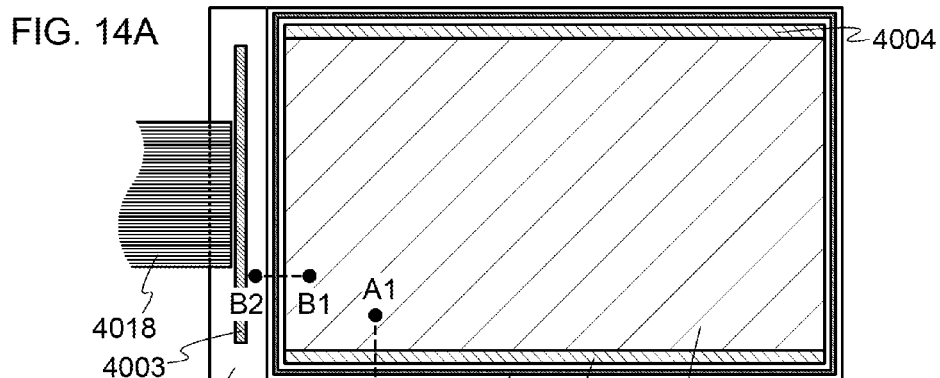
FIGS. 14A to 14C are a top view and cross-sectional views of a liquid crystal display device.
Figure 14B:
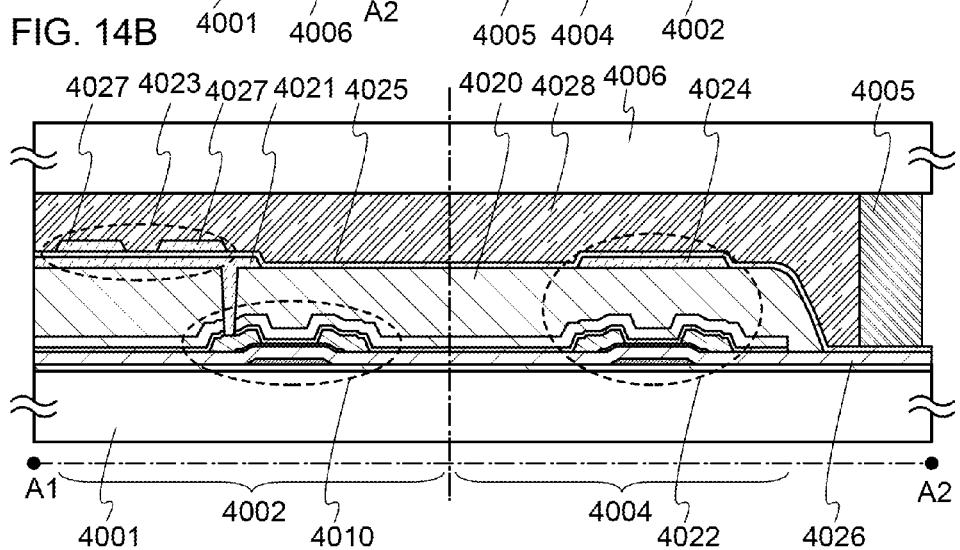
Figure 14C:
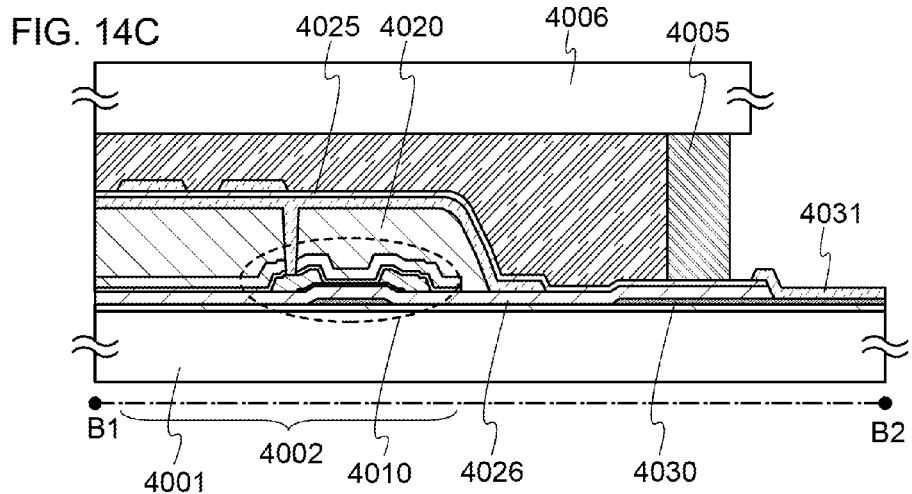

The appearance of a semiconductor device of one embodiment of the present invention will be described; in this embodiment, a liquid crystal display device will be described as an example of a semiconductor device of one embodiment of the present invention with reference to FIGS. 14A to 14C. FIG. 14A is a top view of a liquid crystal display device where a substrate 4001 and a substrate 4006 are bonded to each other with a sealant 4005. FIG. 14B corresponds to a cross-sectional view taken along broken line A1-A2 in FIG. 14A. FIG. 14C corresponds to a cross-sectional view taken along broken line B1-B2 in FIG. 14A. Note that FIGS. 14A to 14C illustrate a fringe field switching (FFS)-mode liquid crystal display device.

The sealant 4005 is provided to surround a pixel portion 4002 and a pair of scan line driver circuits 4004 provided over the substrate 4001. The substrate 4006 is provided over the pixel portion 4002 and the scan line driver circuit 4004. Thus, the pixel portion 4002 and the scan line driver circuit 4004 are sealed by the substrate 4001, the sealant 4005, and the substrate 4006. A signal line driver circuit 4003 is mounted in a region which is different from a region surrounded by the sealant 4005 over the substrate 4001.

Note that the sequential circuit according to one embodiment of the present invention can be used as the scan line driver circuit 4004. As a result, W/L of the transistor can be small and thus the frame size can be small.

A plurality of transistors is included in the pixel portion 4002 and the scan line driver circuit 4004 which are provided over the substrate 4001. FIG. 14B illustrates a transistor 4010 included in the pixel portion 4002 and a transistor 4022 included in the scan line driver circuit 4004. FIG. 14C illustrates the transistor 4010 included in the pixel portion 4002.

In the pixel portion 4002 and the scan line driver circuit 4004, an insulating film 4020 formed using a resin is provided over the transistor 4010 and the transistor 4022. A first electrode 4021 of a liquid crystal element 4023 and a conductive film 4024 are provided over the insulating film 4020. The conductive film 4024 can function as a discharge path for electric charge accumulated in the insulating film 4020. Alternatively, the conductive film 4024 and the insulating film 4020 can be included as components of the transistor 4022, and the conductive film 4024 can function as a back gate.

An insulating film 4025 is provided over the insulating film 4020, the first electrode 4021, and the conductive film 4024. The insulating film 4025 preferably has a high effect of blocking diffusion of water, hydrogen, and the like. As the insulating film 4025, a silicon nitride film, a silicon nitride oxide film, or the like can be used.

As illustrated in FIGS. 14B and 14C, in one embodiment of the present invention, the insulating film 4020 is removed at an end portion of the panel. The insulating film 4025 over the insulating film 4020 is in contact with an insulating film 4026 functioning as a gate insulating film of each of the transistors 4010 and 4022 between the sealant 4005 and the substrate 4001.

In the case where the insulating film 4025 and the insulating film 4026 each have a high effect of blocking diffusion of water, hydrogen, and the like, when the insulating film 4025 is in contact with the insulating film 4026 at an end portion of the panel, entry of water, hydrogen, and the like from the outside of the panel or the sealant 4005 into semiconductor films of the transistors 4010 and 4022 can be prevented.

A second electrode 4027 of the liquid crystal element 4023 is provided over the insulating film 4025. A liquid crystal layer 4028 is provided between the second electrode 4027 and the insulating film 4025, and the substrate 4006. The liquid crystal element 4023 includes the first electrode 4021, the second electrode 4027, and the liquid crystal layer 4028.

In the liquid crystal element 4023, alignment of liquid crystal molecules included in the liquid crystal layer 4028 is changed in accordance with the level of voltage applied between the first electrode 4021 and the second electrode 4027, so that transmittance is changed. Accordingly, when the transmittance of the liquid crystal element 4023 is controlled by the potential of an image signal input to the first electrode 4021, gradation can be expressed.

In the liquid crystal display device of one embodiment of the present invention, the liquid crystal layer can be formed using, for example, a liquid crystal material classified into a thermotropic liquid crystal or a lyotropic liquid crystal. As another example of a liquid crystal material used for the liquid crystal layer, the following can be given: a nematic liquid crystal, a smectic liquid crystal, a cholesteric liquid crystal, or a discotic liquid crystal. Further alternatively, a liquid crystal material categorized by a ferroelectric liquid crystal or an anti-ferroelectric liquid crystal can be used. Further alternatively, a liquid crystal material categorized by a high-molecular liquid crystal such as a main-chain high-molecular liquid crystal, a side-chain high-molecular liquid crystal, or a composite-type high-molecular liquid crystal, or a low-molecular liquid crystal can be used. Further alternatively, a liquid crystal material categorized by a polymer dispersed liquid crystal (PDLC) can be used.

Note that a liquid crystal exhibiting a blue phase for which an alignment film is not used may be used for the liquid crystal layer. A blue phase is one of liquid crystal phases, which is generated just before a cholesteric phase changes into an isotropic phase while temperature of cholesteric liquid crystal is increased. Since the blue phase is only generated within a narrow range of temperature, a chiral material or an ultraviolet curable resin is added so that the temperature range is improved. The liquid crystal composition which includes a liquid crystal exhibiting a blue phase and a chiral material is preferable because it has a small response time of less than or equal to 1 msec, has optical isotropy, which makes the alignment process unneeded, and has a small viewing angle dependence.

The liquid crystal display device of one embodiment of the present invention may display a color image by using a color filter or may display a color image by sequentially turning on a plurality of light sources whose hues are different from each other.

Image signals from the signal line driver circuit 4003 and a variety of control signals and power supply potentials from an FPC 4018 are supplied to the scan line driver circuit 4004 or the pixel portion 4002 through lead wirings 4030 and 4031.

Although a fringe field switching (FFS) mode is used as a method for driving the liquid crystal in this embodiment, the following can be used as a method for driving the liquid crystal: a twisted nematic (TN) mode, a super twisted nematic (STN) mode, a vertical alignment (VA) mode, a multi-domain vertical alignment (MVA) mode, an in-plane-switching (IPS) mode, an optically compensated birefringence (OCB) mode, a blue phase mode, a transverse bend alignment (TBA) mode, a VA-IPS mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, an advanced super view mode, and the like.

This embodiment can be implemented in appropriate combination with any of the structures described in the other embodiments.

[Embodiment 7]

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other than the above, as an electronic appliance which can use the semiconductor device according to one embodiment of the present invention, mobile phones, game machines including portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of such electronic devices are illustrated in FIGS. 15A to 15E.

Figure 15A:
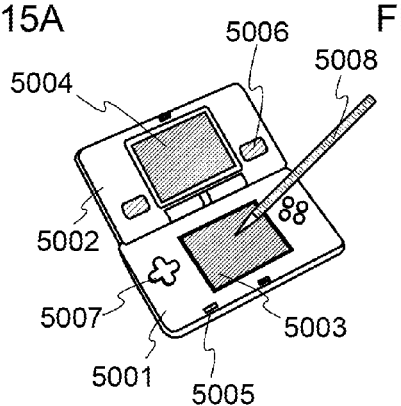
FIGS. 15A to 15E illustrate an electronic device.

FIG. 15A illustrates a portable game machine, which includes a housing 5001, a housing 5002, a display portion 5003, a display portion 5004, a microphone 5005, a speaker 5006, an operation key 5007, a stylus 5008, and the like. A semiconductor device of one embodiment of the present invention can be used for the display portion 5003, the display portion 5004, or a circuit in another portion. Note that although the portable game machine illustrated in FIG. 15A has the two display portions 5003 and 5004, the number of display portions included in the portable game machine is not limited thereto.

Figure 15B:
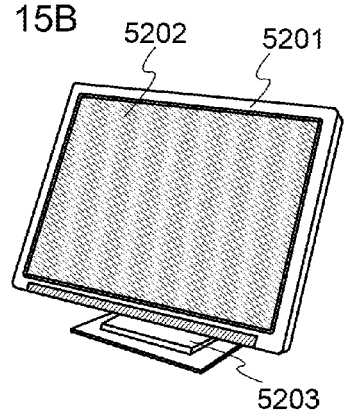

FIG. 15B illustrates a display device, which includes a housing 5201, a display portion 5202, a support 5203, and the like. A semiconductor device of one embodiment of the present invention can be used for the display portion 5202 or a circuit in another portion. Note that a display device includes, in its category, any display device for displaying information, such as display devices for personal computers, TV broadcast reception, and advertisement.

Figure 15C:
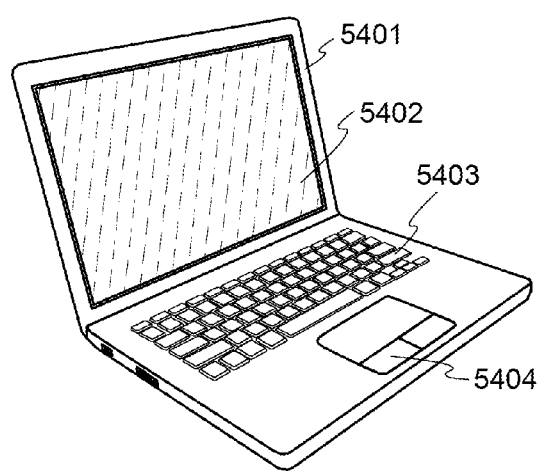

FIG. 15C illustrates a laptop, which includes a housing 5401, a display portion 5402, a keyboard 5403, a pointing device 5404, and the like. A semiconductor device of one embodiment of the present invention can be used for the display portion 5402 or a circuit in another portion.

Figure 15D:
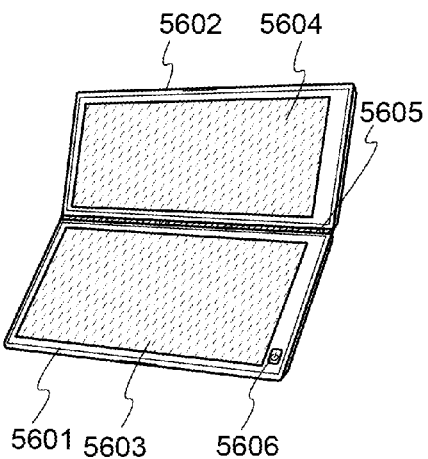

FIG. 15D illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. A semiconductor device of one embodiment of the present invention can be used for the first display portion 5603, the second display portion 5604, or a circuit in another portion. A semiconductor device with a position input function may be used as at least one of the first display portion 5603 and the second display portion 5604. Note that the position input function can be added by providing a touch panel in a semiconductor device. Alternatively, the position input function can be added by providing a photoelectric conversion element called a photosensor in a pixel area of a semiconductor device.

Figure 15E:
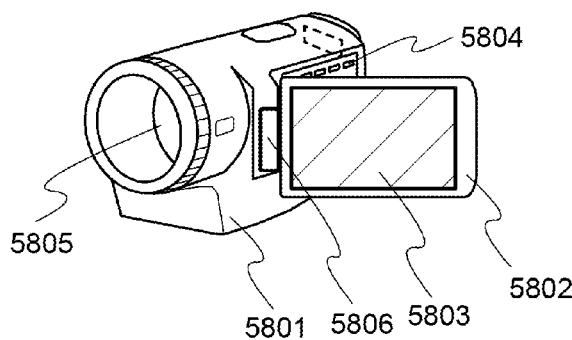

FIG. 15E illustrates a video camera, which includes a first housing 5801, a second housing 5802, a display portion 5803, operation keys 5804, a lens 5805, a joint 5806, and the like. The operation keys 5804 and the lens 5805 are provided for the first housing 5801, and the display portion 5803 is provided for the second housing 5802. The first housing 5801 and the second housing 5802 are connected to each other with the joint 5806, and an angle between the first housing 5801 and the second housing 5802 can be changed with the joint 5806. The image displayed on the display portion 5803 may be switched depending on the angle in the joint 5806 between the first housing 5801 and the second housing 5802. A semiconductor device of one embodiment of the present invention can be used for the display portion 5803 or a circuit in another portion.

One embodiment of the present invention includes the following semiconductor device in its category.

Figure 16A:
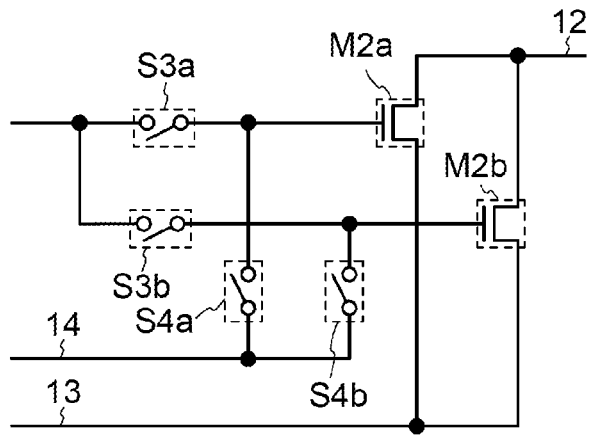
FIGS. 16A to 16C illustrate a configuration of a sequential circuit.

One embodiment of the present invention is a semiconductor device including the transistors M2a and M2b, the switches S3a, S3b, S4a, and S4b. The first terminal and the second terminal of the transistor M2a are connected to the wiring 13 and the wiring 12, respectively. The first terminal and the second terminal of the transistor M2b are connected to the wiring 13 and the wiring 12, respectively. The second terminal of the switch S3a is connected to the gate of the transistor M2a. The first terminal and the second terminal of the switch S3b are connected to the first terminal of the switch S3a and the gate of the transistor M2b, respectively. The first terminal and the second terminal of the switch S4a are connected to the wiring 14 and the gate of the transistor M2a, respectively. The first terminal and the second terminal of the switch S4b are connected to the wiring 14 and the gate of the transistor M2b, respectively (see FIG. 16A).

Note that the semiconductor device may include a period Ta during which the switches S3a and S4b are on and the switches S3b and S4a are off, and a period Tb during which the switches S3a and S4b are off and the switches S3b and S4a are on. Further, a period during which the switches S3a, S3b, S4a, and S4b are off may be included.

Note that in the semiconductor device, the period Ta may include the period T3a during which the potential of the first terminal of the switch S3a has a value for turning on the transistor M2a and the potential of the wiring 14 has a value for turning on the transistor M2b, and the period T4a during which the potential of the first terminal of the switch S3a has a value for turning on the transistor M2a and the potential of the wiring 14 has a value for turning off the transistor M2b. The period Tb may include the period T3b during which the potential of the first terminal of the switch S3b has a value for turning on the transistor M2b and the potential of the wiring 14 has a value for turning on the transistor M2a, and the period T4b during which the potential of the first terminal of the switch S3b has a value for turning on the transistor M2b and the potential of the wiring 14 has a value for turning off the transistor M2a.

Figure 16B:
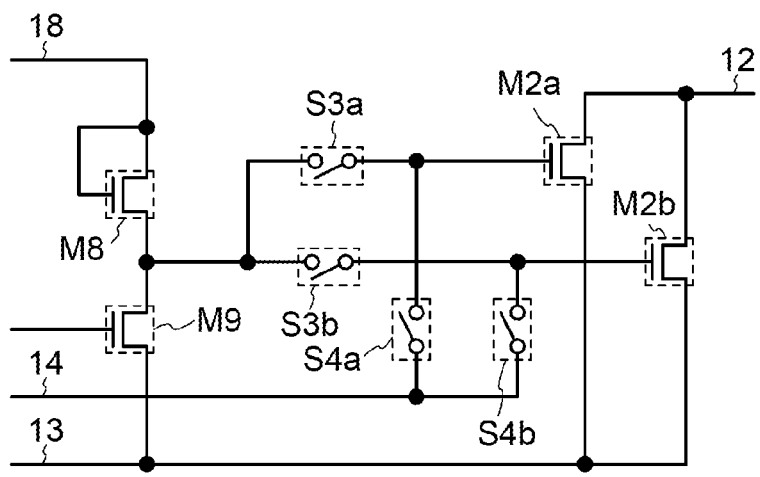

Note that the semiconductor device may include the transistor M8 and the transistor M9. The first terminal, the second terminal, and the gate of the transistor M8 are connected to the wiring 18, the first terminal of the switch S3a, and the wiring 18, respectively. The first terminal and the second terminal of the transistor M9 are connected to the wiring 13 and the first terminal of the switch S3a, respectively (see FIG. 16B).

Figure 16C:
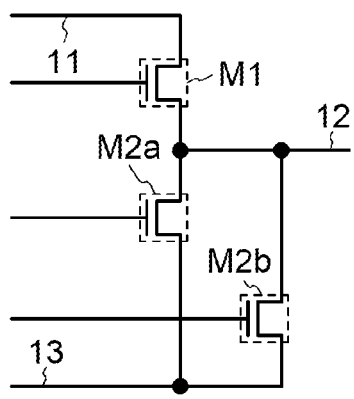
Figure 17A:
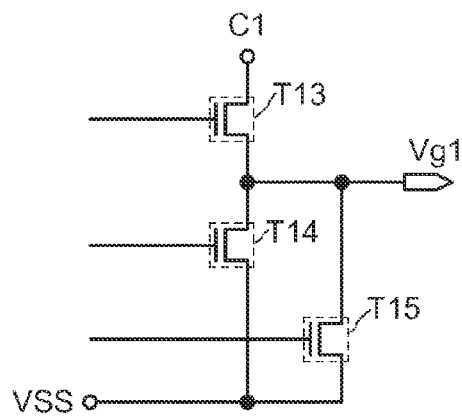
FIGS. 17A to 17D illustrate configurations and operation of a conventional sequential circuit.
Figure 17B:
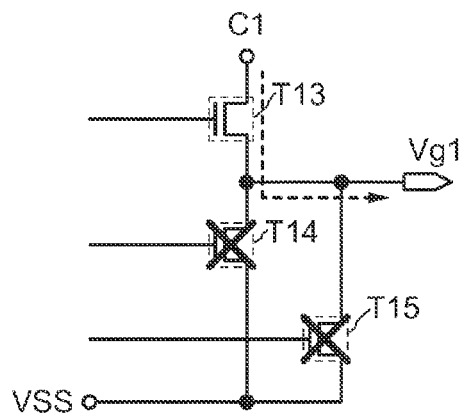
Figure 17C:
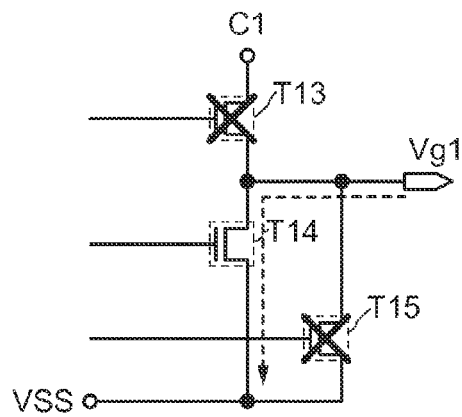
Figure 17D:
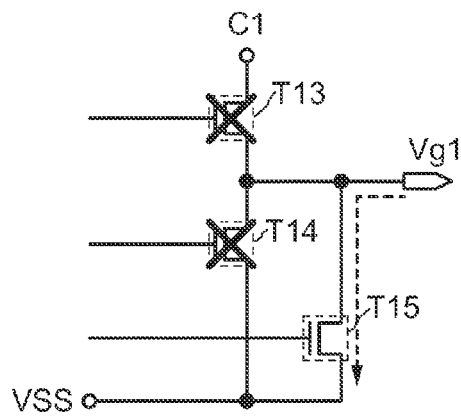

One embodiment of the present invention is a semiconductor device including the transistor M1, the transistor M2a, and the transistor M2b. The first terminal of the transistor M1 is connected to the wiring 11, and the second terminal of M1 is connected to the wiring 12. The first terminal of the transistor M2a is connected to the wiring 13, and the second terminal of M2a is connected to the wiring 12. The first terminal and the second terminal of the transistor M2b are connected to the wiring 13 and the wiring 12, respectively (see FIG. 16C). The semiconductor device includes a period (e.g., the period T1a, T2a, T1b, or T2b) during which the transistor M1 is on and the transistors M2a and M2b are off, a period (e.g., the period T3a or T3b) during which the transistor M1 is off and the transistors M2a and M2b are on, a period (e.g., the period T4a) during which the transistors M1 and M2b are off and the transistor M2a is on, and a period (e.g., the period T4b) during which the transistors M1 and M2a are off and the transistor M2b is on.

This embodiment can be implemented in appropriate combination with any of the structures described in the other embodiments.

This application is based on Japanese Patent Application serial No. 2012-197224 filed with Japan Patent Office on Sep. 7, 2012, the entire contents of which are hereby incorporated by reference.

What is claimed is:
1. A semiconductor device comprising:
a first transistor;
a second transistor:
a first switch;
a second switch;
a third switch; and
a fourth switch,
wherein one of a source and a drain of the first transistor is electrically connected to a first wiring,
wherein the other of the source and the drain of the first transistor is electrically connected to a second wiring,
wherein one of a source and a drain of the second transistor is electrically connected to the first wiring,
wherein the other of the source and the drain of the second transistor is electrically connected to the second wiring,
wherein a first terminal of the first switch is electrically connected to a gate of the first transistor,
wherein a first terminal of the second switch is electrically connected to a gate of the second transistor,
wherein a second terminal of the second switch is electrically connected to a second terminal of the first switch,
wherein a first terminal of the third switch is electrically connected to the gate of the first transistor,
wherein a second terminal of the third switch is electrically connected to a third wiring,
wherein a first terminal of the fourth switch is electrically connected to the gate of the second transistor,
wherein a second terminal of the fourth switch is electrically connected to the third wiring,
wherein a channel width of the first transistor is more than or equal to 90% and less than or equal to 110% of a channel width of the second transistor,
wherein a gate of the first switch and a gate of the fourth switch are electrically connected with each other, and
wherein a gate of the second switch and a gate of the third switch are electrically connected with each other.

2. The semiconductor device according to claim 1, further comprising:
a third transistor; and
a fourth transistor,
wherein one of a source and a drain of the third transistor is electrically connected to a fourth wiring,
wherein the other of the source and the drain of the third transistor is electrically connected to a second terminal of the first switch,
wherein one of a source and a drain of the fourth transistor is electrically connected to the second wiring, and
wherein the other of the source and the drain of the fourth transistor is electrically connected to the second terminal of the first switch.

3. The semiconductor device according to claim 1, wherein the third wiring has a function of transmitting a signal.

4. The semiconductor device according to claim 1, wherein each of the first transistor and the second transistor includes an oxide semiconductor in a channel formation region.

5. The semiconductor device according to claim 1, wherein the semiconductor device is one selected from the group consisting of a portable game machine, a display device, a laptop, a personal digital assistant, and a video camera.

6. A semiconductor device comprising:
a first transistor;
a second transistor:
a first switch;
a second switch;
a third switch; and
a fourth switch,
wherein one of a source and a drain of the first transistor is electrically connected to a first wiring,
wherein the other of the source and the drain of the first transistor is electrically connected to a second wiring,
wherein one of a source and a drain of the second transistor is electrically connected to the first wiring,
wherein the other of the source and the drain of the second transistor is electrically connected to the second wiring,
wherein a first terminal of the first switch is electrically connected to a gate of the first transistor,
wherein a first terminal of the second switch is electrically connected to a gate of the second transistor,
wherein a second terminal of the second switch is electrically connected to a second terminal of the first switch,
wherein a first terminal of the third switch is electrically connected to the gate of the first transistor,
wherein a second terminal of the third switch is electrically connected to a third wiring,
wherein a first terminal of the fourth switch is electrically connected to the gate of the second transistor,
wherein a second terminal of the fourth switch is electrically connected to the third wiring,
wherein a gate of the first switch and a gate of the fourth switch are electrically connected with each other, and
wherein a gate of the second switch and a gate of the third switch are electrically connected with each other.

7. The semiconductor device according to claim 6, further comprising:
a third transistor; and
a fourth transistor,
wherein one of a source and a drain of the third transistor is electrically connected to a fourth wiring,
wherein the other of the source and the drain of the third transistor is electrically connected to a second terminal of the first switch,
wherein one of a source and a drain of the fourth transistor is electrically connected to the second wiring, and
wherein the other of the source and the drain of the fourth transistor is electrically connected to the second terminal of the first switch.

8. The semiconductor device according to claim 6, wherein the third wiring has a function of transmitting a signal.

9. The semiconductor device according to claim 6, wherein each of the first transistor and the second transistor includes an oxide semiconductor in a channel formation region.

10. The semiconductor device according to claim 6, wherein the semiconductor device is one selected from the group consisting of a portable game machine, a display device, a laptop, a personal digital assistant, and a video camera.

* * * * *